(12) United States Patent
Zhang et al.

(10) Patent No.: US 12,283,324 B2
(45) Date of Patent: Apr. 22, 2025

(54) ARRAY DEPENDENT VOLTAGE COMPENSATION IN A MEMORY DEVICE

(71) Applicant: SanDisk Technologies LLC, Addison, TX (US)

(72) Inventors: Ke Zhang, Shanghai (CN); Liang Li, Shanghai (CN); Ming Wang, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 192 days.

(21) Appl. No.: 17/838,004

(22) Filed: Jun. 10, 2022

(65) Prior Publication Data

US 2023/0402099 A1 Dec. 14, 2023

(51) Int. Cl.
| | | |
|---|---|---|
| G11C 16/10 | (2006.01) | |
| G11C 11/56 | (2006.01) | |
| G11C 16/04 | (2006.01) | |
| G11C 16/16 | (2006.01) | |
| H01L 23/00 | (2006.01) | |
| H01L 25/065 | (2023.01) | |
| H01L 25/18 | (2023.01) | |

(52) U.S. Cl.
CPC .......... *G11C 16/10* (2013.01); *G11C 11/5628* (2013.01); *G11C 11/5635* (2013.01); *G11C 11/5671* (2013.01); *G11C 16/0483* (2013.01); *G11C 16/16* (2013.01); *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(58) Field of Classification Search
CPC ....................................... G11C 16/10

USPC ..................................... 365/185.03
See application file for complete search history.

(56) References Cited

U.S. PATENT DOCUMENTS

| | | |
|---|---|---|
| 9,343,156 B1 | 5/2016 | Mui et al. |
| 10,069,490 B2 | 9/2018 | Kannan et al. |
| 10,438,656 B2 | 10/2019 | Madraswala et al. |

(Continued)

FOREIGN PATENT DOCUMENTS

CN 114023365 A 2/2022

OTHER PUBLICATIONS

Ali Khakifirooz et al, "A 1Tb 4b/Cell 144-Tier Floating-Gate 2D-NAND Flash Memory with 40MB/s Program Throughput and 13.8Gb/mm2Bit Density", ISSCC 2021 / Session 30 / Non-Volatile Memories /30.2, 2021 IEEE Program, pp. 1-24, International Solid-State Circuits Conference, Intel Corporation, Santa Clara, CA, USA.*

(Continued)

*Primary Examiner* — Muna A Techane
(74) *Attorney, Agent, or Firm* — Steven C. Hurles; Dickinson Wright PLLC

(57) ABSTRACT

The memory device that includes a die with a CMOS wafer with programming and erasing circuitry. The die also includes a plurality of array wafers coupled with and in electrical communication with the CMOS wafer and having different programming and erasing efficiencies. Each of the array wafers includes memory blocks with memory cells. The control circuitry of the CMOS wafer is configured to output at least one of different initial programming voltages and unique erase voltages to the plurality of array wafers.

14 Claims, 19 Drawing Sheets

(56) References Cited

U.S. PATENT DOCUMENTS

| | | | |
|---|---|---|---|
| 10,892,025 B2* | 1/2021 | Banerjee | G06F 13/1668 |
| 11,024,385 B2 | 6/2021 | Chibvongodze et al. | |
| 2005/0013166 A1* | 1/2005 | Chen | G11C 16/12 |
| | | | 365/185.03 |
| 2012/0099375 A1* | 4/2012 | Choi | G11C 16/0483 |
| | | | 365/185.11 |
| 2014/0146609 A1* | 5/2014 | Avila | G06F 3/0619 |
| | | | 365/185.17 |
| 2014/0247661 A1* | 9/2014 | Costa | G11C 11/5635 |
| | | | 365/185.11 |
| 2015/0364185 A1* | 12/2015 | Yoo | G11C 11/5635 |
| | | | 365/185.03 |

OTHER PUBLICATIONS

Ali Khakifirooz et al, "A 1Tb 4b/Cell 144-Tier Floating-Gate 3D-NAND Flash Memory with 40MB/s Program Throughput and 13.8Gb/mm2Bit Density", ISSCC 2021 / Session 30 / Non-Volatile Memories / 30.2, 2021 IEEE Program, pp. 1-24, International Solid-State Circuits Conference, Intel Corporation, Santa Clara, CA, USA.

* cited by examiner

ARRAY DEPENDENT VOLTAGE COMPENSATION IN A MEMORY DEVICE

BACKGROUND

1. Field

The present disclosure is related generally to a memory die architectures and to programming and erasing techniques to improve performance and reliability in dies that have certain architectures.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

Such non-volatile memory devices generally include a plurality of memory cells that are arranged in memory blocks, which each include a plurality of word lines. The memory cells are configured to be programmed to retain threshold voltages that are associated with programmed data states. A programming operation includes a plurality of program-verify iterations or program loops, each of which includes the application of a programming pulse to a selected word line of the plurality of word lines to inject electrons into a charge trapping material within each memory cell. After each programming pulse, the memory cells of the selected word line can be sensed, or read, to determine if their desired threshold voltages have been reached and, if so, inhibit further programming during later programming pulses. If the verify operation passes for all data states, then programming is completed.

SUMMARY

One aspect of the present disclosure is related to a memory device that includes a die with a CMOS wafer that includes programming and erasing circuitry. The die also includes a plurality of array wafers coupled with and in electrical communication with the CMOS wafer. The plurality of array wafers include memory blocks with memory cells. The control circuitry of the CMOS wafer is configured to output at least one of different initial programming voltages and unique erase voltages to the plurality of array wafers.

According to another aspect of the present disclosure, the plurality of array wafers includes a first array wafer that is bonded with the CMOS wafer and a second array wafer that is bonded with the first array wafer on an opposite side of the first array wafer from the CMOS wafer. The first array wafer has high programming and erasing efficiencies, and the second array wafer has low programming and erase efficiencies.

According to yet another aspect of the present disclosure, the control circuitry of the CMOS wafer is configured to output different initial programming voltages to the memory blocks of the first array wafer and to the memory blocks of the second array wafer during programming operations.

According to still another aspect of the present disclosure, the programming and erasing circuitry is configured to output a first initial programming voltage to the memory blocks of the first array wafer and is configured to apply a second initial programming voltage to the memory blocks of the second array wafer. The second initial programming voltage has a greater magnitude than the first initial programming voltage.

According to a further aspect of the present disclosure, the different initial programming voltages that the programming and erasing circuitry is configured to output to the memory blocks of the first array wafer and to the memory blocks of the second array wafer include different programming voltages VPGMSLC for programming the memory cells to one bit per memory cell in a single pulse programming operation.

According to yet a further aspect of the present disclosure, the different initial programming voltages that the programming and erasing circuitry is configured to output to the memory blocks of the first array wafer and to the memory blocks of the second array wafer include different starting programming voltages VPGMU for programming the memory cells to multiple bits per memory cell in a multi-loop programming operation.

According to still a further aspect of the present disclosure, the programming and erasing circuitry of the CMOS wafer is configured to output different erase voltages to the memory blocks of the first array wafer and to the memory blocks of the second array wafer during erase operations.

According to another aspect of the present disclosure, the control circuitry is configured to output a first erase voltage to the memory blocks of the first array wafer and to output a second erase voltage to the memory blocks of the second array wafer. The first erase voltage has a greater magnitude than the second erase voltage.

Another aspect of the present disclosure is related to a method of operating a memory device. The method includes the step of preparing a die that includes a CMOS wafer and a plurality of array wafers that are coupled with and in electrical communication with the CMOS wafer. The plurality of array wafers include memory blocks with memory cells and include a first array wafer and a second array wafer. In programming operations, with programming circuitry in the CMOS wafer, the method proceeds with the step of applying a first initial programming voltage to the memory blocks of the first array wafer and applying a second initial programming voltage to the memory blocks of the second array wafer. The first initial programming voltage is different than the second initial programming voltage. Alternately or additionally, in erase operations, with erasing circuitry in the CMOS wafer, the method proceeds with applying a first erase voltage to the memory blocks of the first array wafer and applying a second erase voltage to the memory blocks of the second array wafer. The first erase voltage is different than the second erase voltage.

According to another aspect of the present disclosure, the first array wafer is bonded with the CMOS wafer and has high programming and erasing efficiencies, and the second array wafer is bonded with the first array wafer on an opposite side of the die from the CMOS wafer and has low programming and erasing efficiencies.

According to yet another aspect of the present disclosure, the method further includes the steps of, in programming operations, with the programming circuitry in the CMOS wafer, applying the first initial programming voltage to the memory blocks of the first array wafer and applying the second initial programming voltage to the memory blocks of the second array wafer.

According to still another aspect of the present disclosure, the second initial programming voltage has a greater magnitude than the first initial programming voltage.

According to a further aspect of the present disclosure, the first initial programming voltage is a VPGMSLC voltage that programs the memory cells in the memory blocks of the first array in a single programming pulse, and the second initial programming voltage is also a VPGMSLC voltage that programs the memory cells in the memory blocks of the second array in a single programming pulse.

According to yet a further aspect of the present disclosure, the first programming voltage is a VPGMU voltage that programs the memory cells in the memory blocks of the first array wafer in a first programming pulse of a multi-loop programming operation, and the second programming voltage is also a VPGMU voltage that programs the memory cells in the memory blocks of the second array wafer in a first programming pulse of a multi-loop programming operation.

According to still a further aspect of the present disclosure, the method further includes the steps of, in the erase operations, with control circuitry in the CMOS wafer, applying the first erase voltage to the memory blocks of the first array wafer and applying the second erase voltage to the memory blocks of the second array wafer. The first erase voltage is different than the second erase voltage.

According to another aspect of the present disclosure, the second erase voltage has a greater magnitude than the first erase voltage.

Yet another aspect of the present disclosure is related to an apparatus that includes a die with a CMOS wafer, a first array wafer, and a second array wafer. The first and second array wafers each include at least one memory block with a plurality of memory cells. The memory cells of the first array wafer have a high programming efficiency and a high erasing efficiency, and the memory cells of the second array have a low programming efficiency and a low erasing efficiency. A programming and erasing means is configured to, in programming operations, apply a first initial programming voltage to the memory cells of the first array wafer and apply a second initial programming voltage to the memory cells of the second array wafer. The second initial programming voltage is different than the first initial programming voltage. The programming and erasing means is further configured to, in erase operations, apply a first erase voltage to the memory cells of the first array wafer and apply a second erase voltage to the memory cells of the second array wafer, the second erase voltage being different than the first erase voltage.

According to another aspect of the present disclosure, the first array wafer is bonded with the CMOS wafer, and the second array wafer is bonded with the first array wafer on an opposite side of the first array wafer from the CMOS wafer.

According to yet another aspect of the present disclosure, the second initial programming voltage is greater in magnitude than the first initial programming voltage.

According to still another aspect of the present disclosure, the second erase voltage is greater in magnitude than the first erase voltage.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which.

DESCRIPTION OF THE ENABLING EMBODIMENT

According to an aspect of the present disclosure, a memory die is provided that includes a single CMOS wafer and multiple (for example, two) array wafers, each of which includes a plurality of memory blocks with memory cells. A first array wafer is bonded directly to the CMOS wafer, and a second array wafer is bonded with the first array wafer on an opposite side of the first array wafer from the CMOS wafer, i.e., the first array wafer separates the second array wafer from the CMOS wafer. The memory cells in the first array wafer, being located closer to the CMOS wafer, have greater programming and erasing efficiencies than the memory cells of the second array wafer. To allow for improved programming performance and reliability across the multiple array wafers, the CMOS wafer includes control circuitry that is configured to apply different initial programming voltages to the memory blocks of the different array wafers such that the memory blocks of each array wafer receive their respective optimized initial programming voltages. Similarly, to improve erasing performance and reliability, the CMOS wafer includes control circuitry that is configured to apply different erase voltages to the memory blocks of the different array wafers such that the memory blocks of each array wafer receive their optimized erase voltages. This die architecture and the programming and erasing techniques are discussed in further detail below.

Figure 1A:
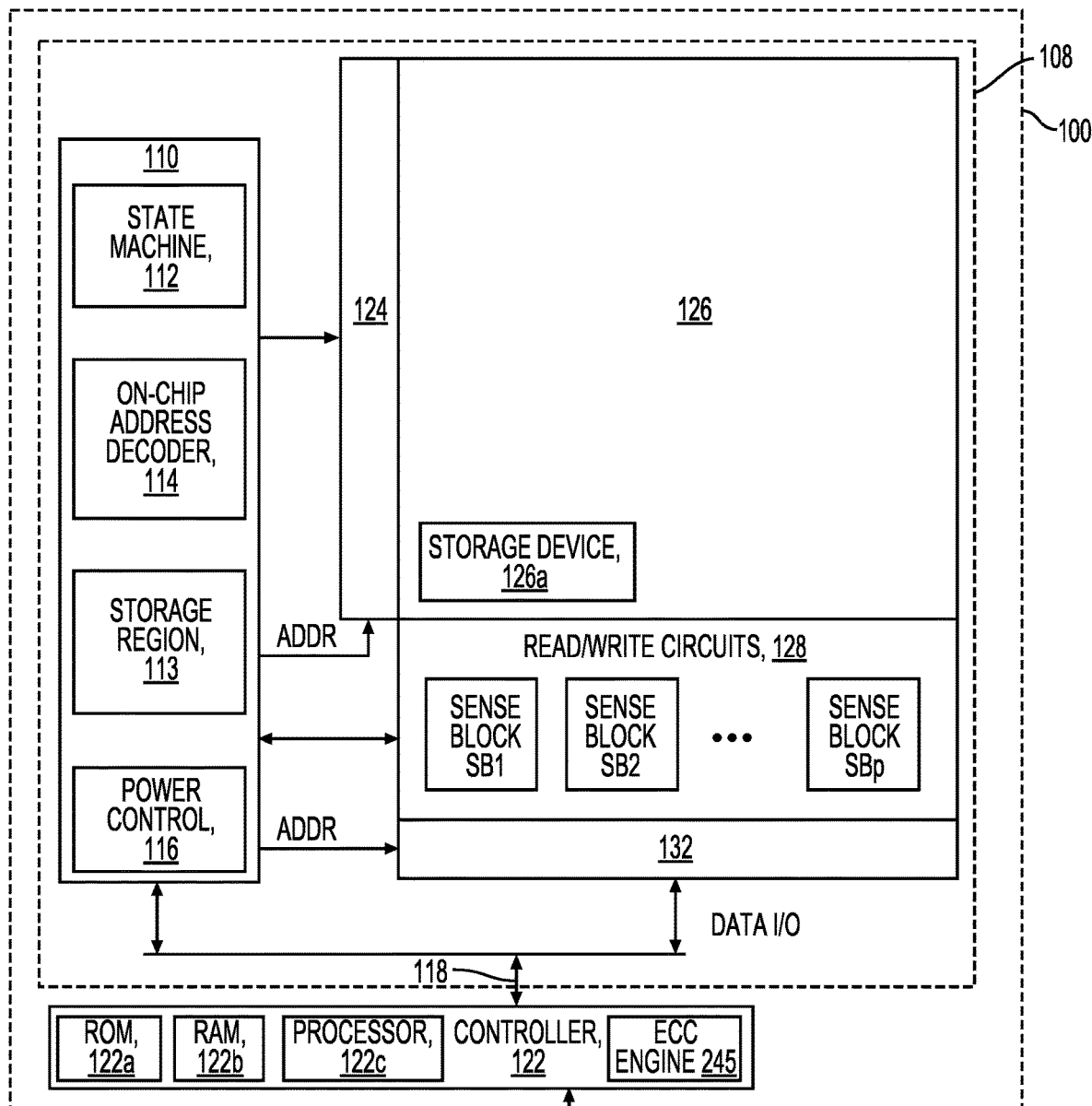
FIG. 1A is a block diagram of an example memory device.

FIG. 1A is a block diagram of an example memory device that may include one or more memory dies 108 that have multiple array wafers, as described above. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, adjustable voltage regulators, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations (program loops); and in each program and verify iteration, the programming circuit performs programming for the one selected word line after which the programming circuit applies a verification signal to the selected word line. The control circuits can also include a counting circuit configured to obtain a count of memory cells which pass a verify test for the one data state. The control circuits can also include a determination circuit configured to determine, based on an amount by which the count exceeds a threshold, if a programming operation is completed.

Figure 1B:
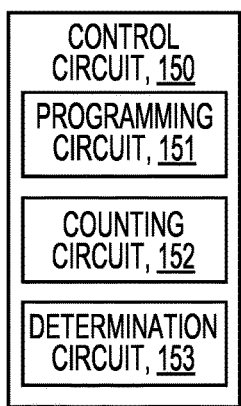
FIG. 1B is a block diagram of an example control circuit.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vt distribution becomes too high.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
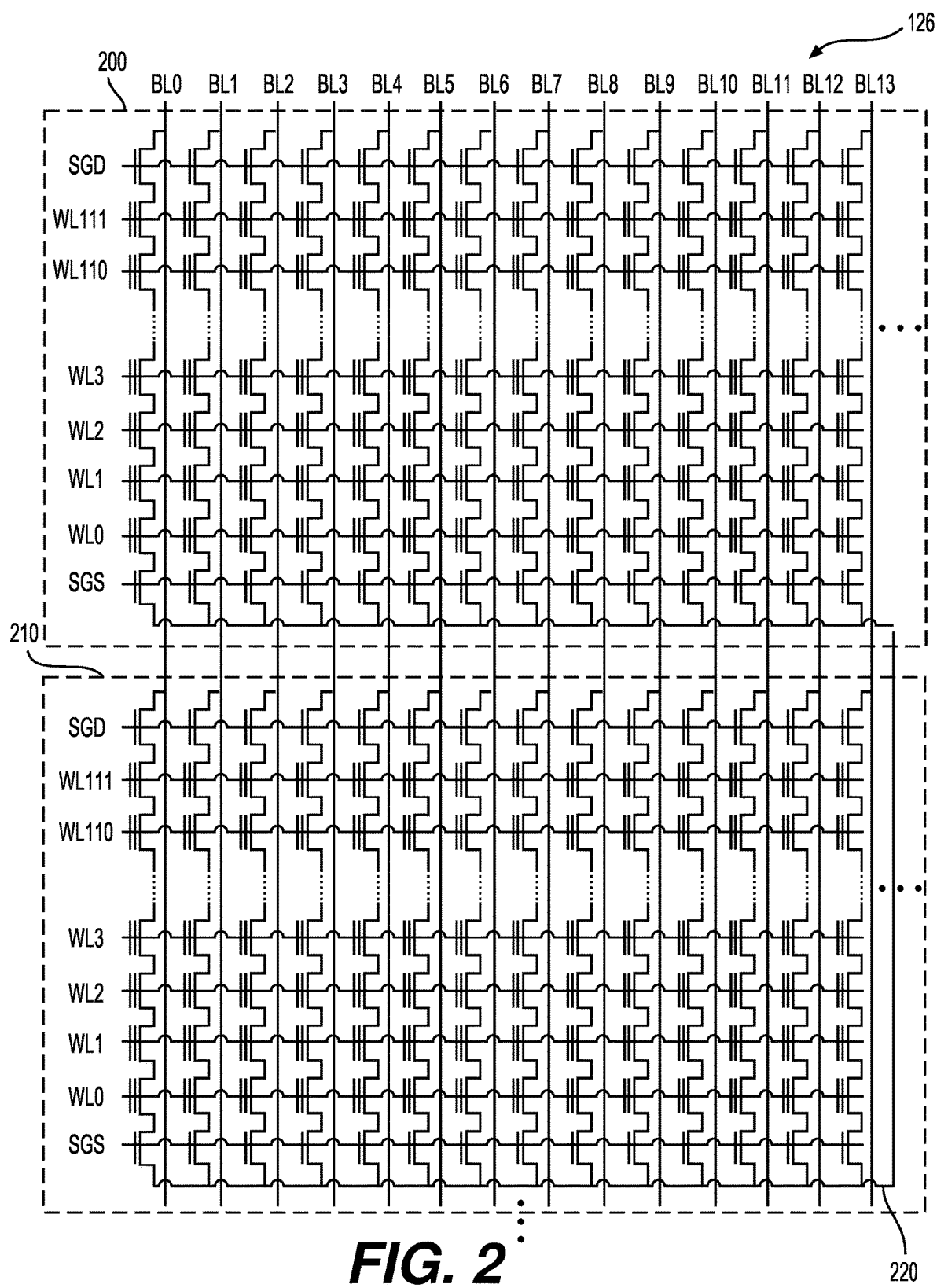
FIG. 2 depicts blocks of memory cells in an example two-dimensional configuration of the memory array of FIG. 1A.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. One hundred and twelve word lines, for example, WL0-WL111, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors. Such dummy word lines can shield the edge data word line from certain edge effects.

Figure 3A:
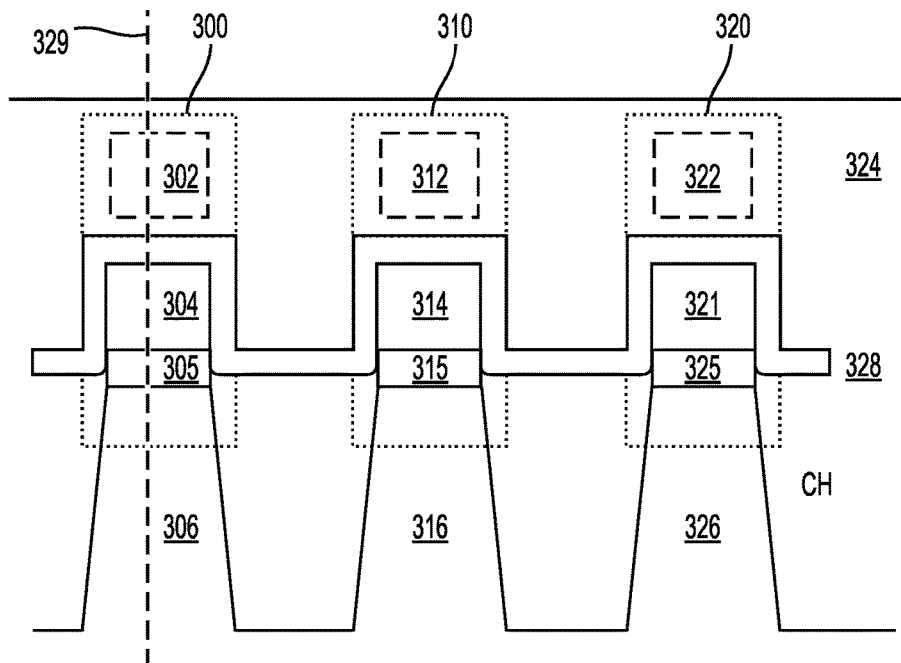
FIG. 3A and FIG. 3B depict cross-sectional views of example floating gate memory cells in NAND strings.
Figure 3B:
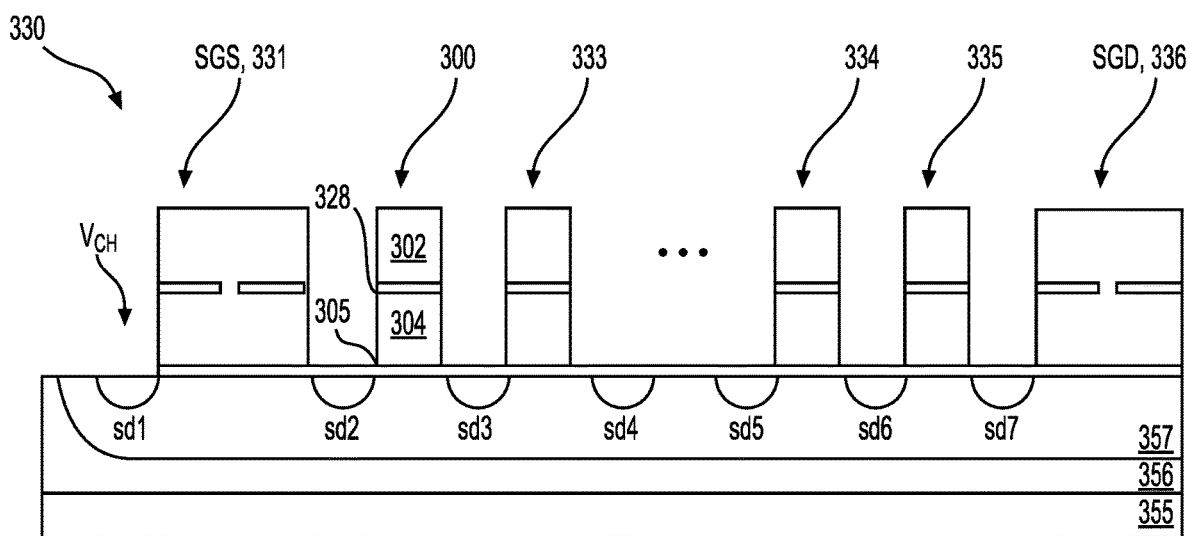

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
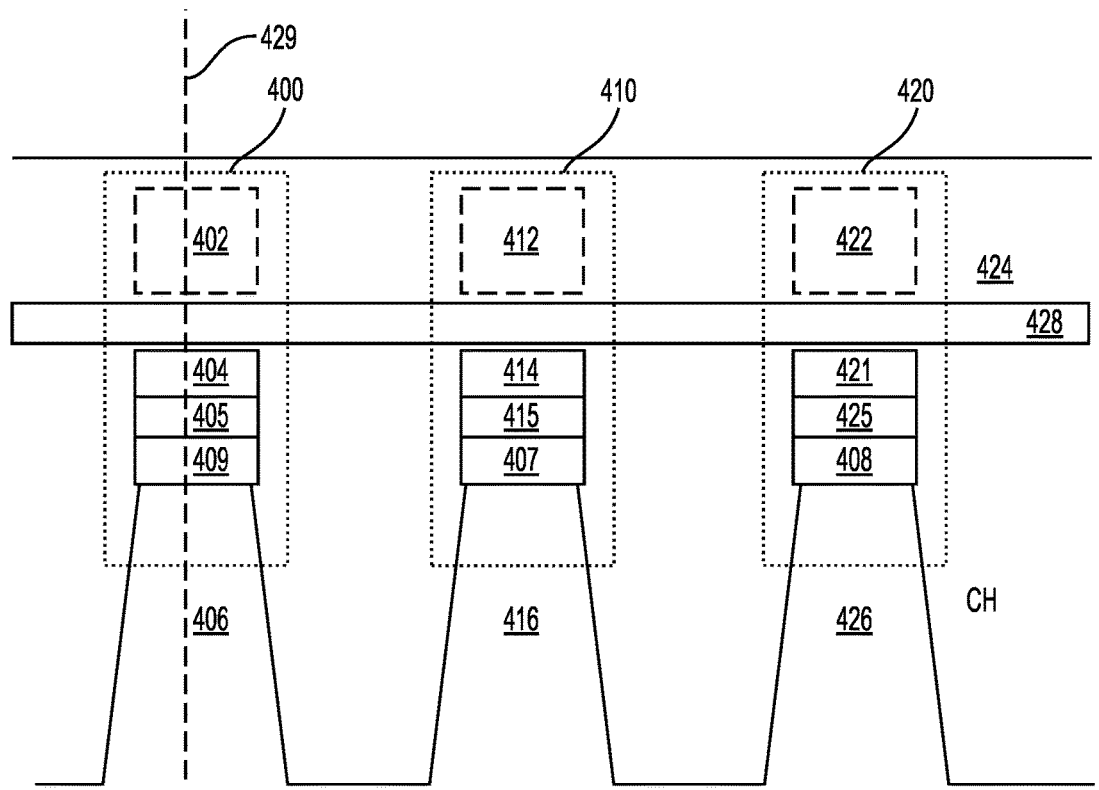
FIG. 4A and FIG. 4B depict cross-sectional views of example charge-trapping memory cells in NAND strings.
Figure 4B:
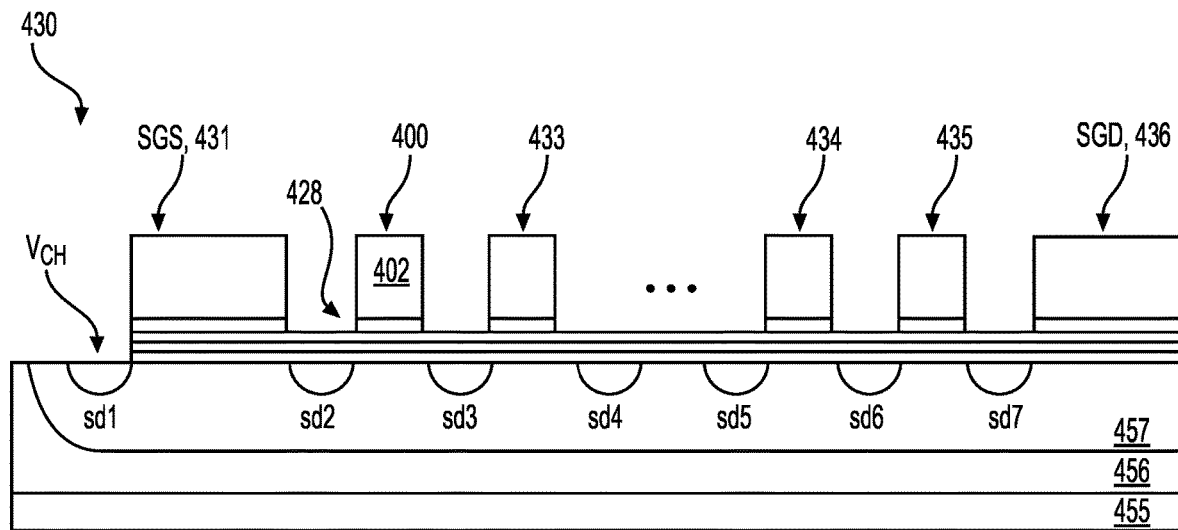

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
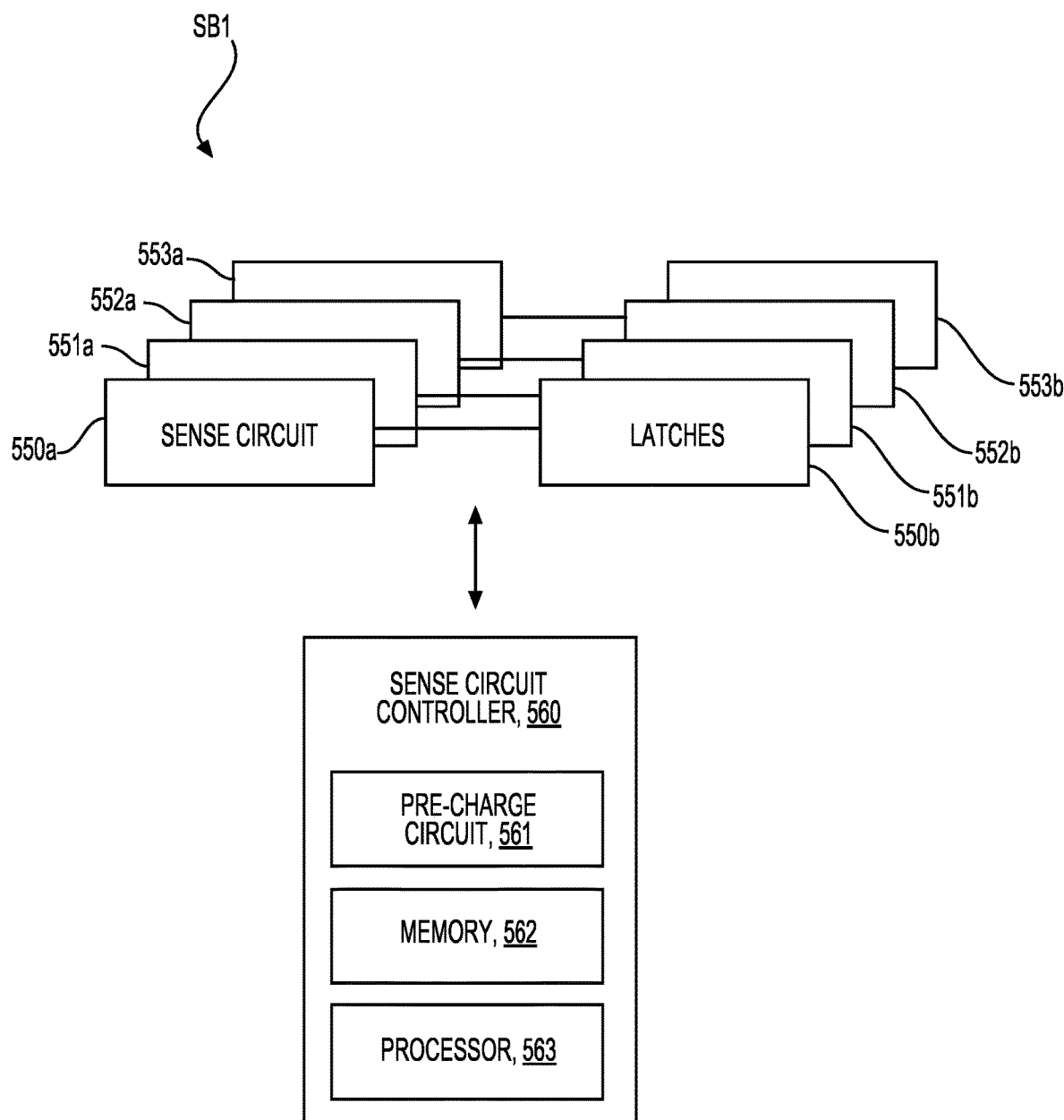
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
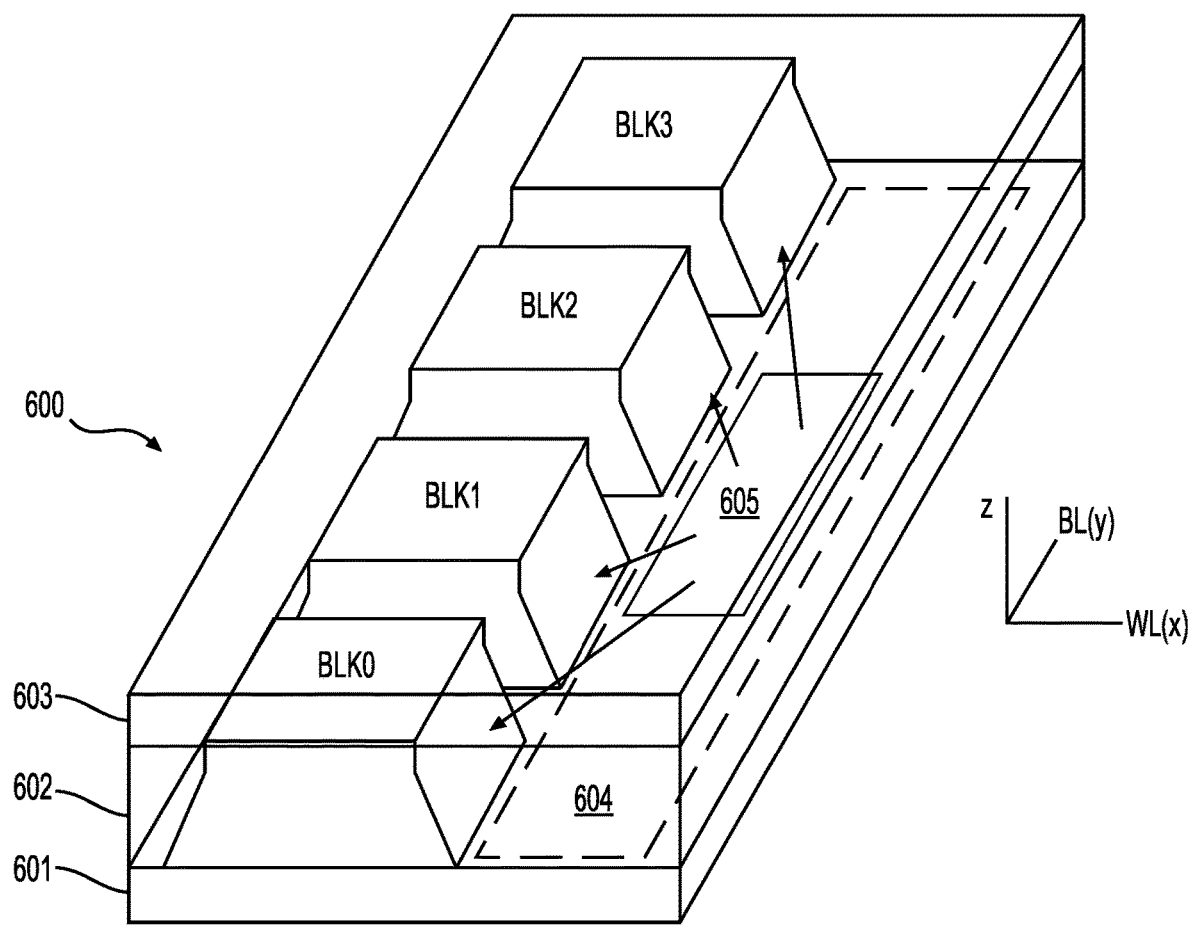
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
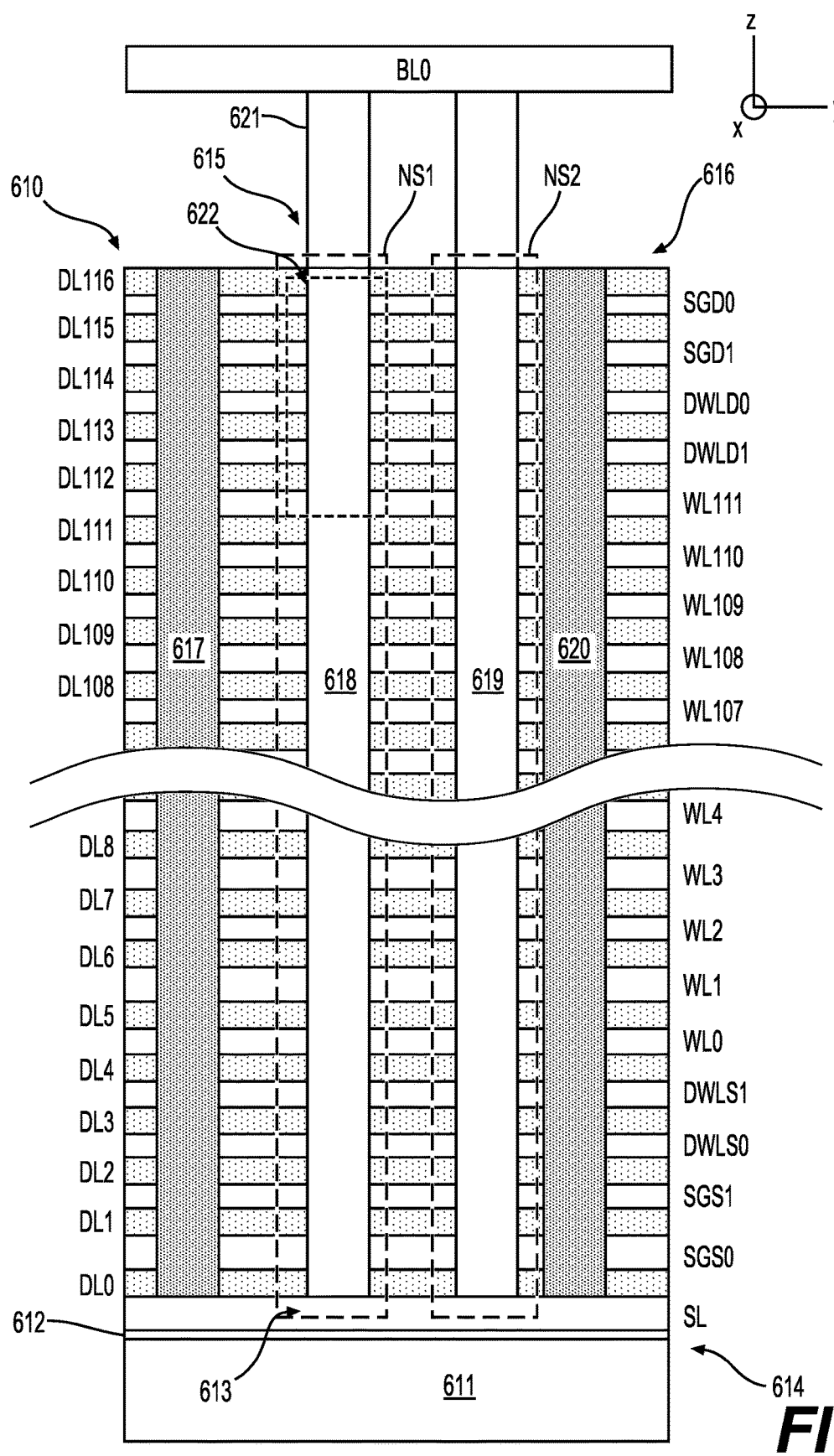
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
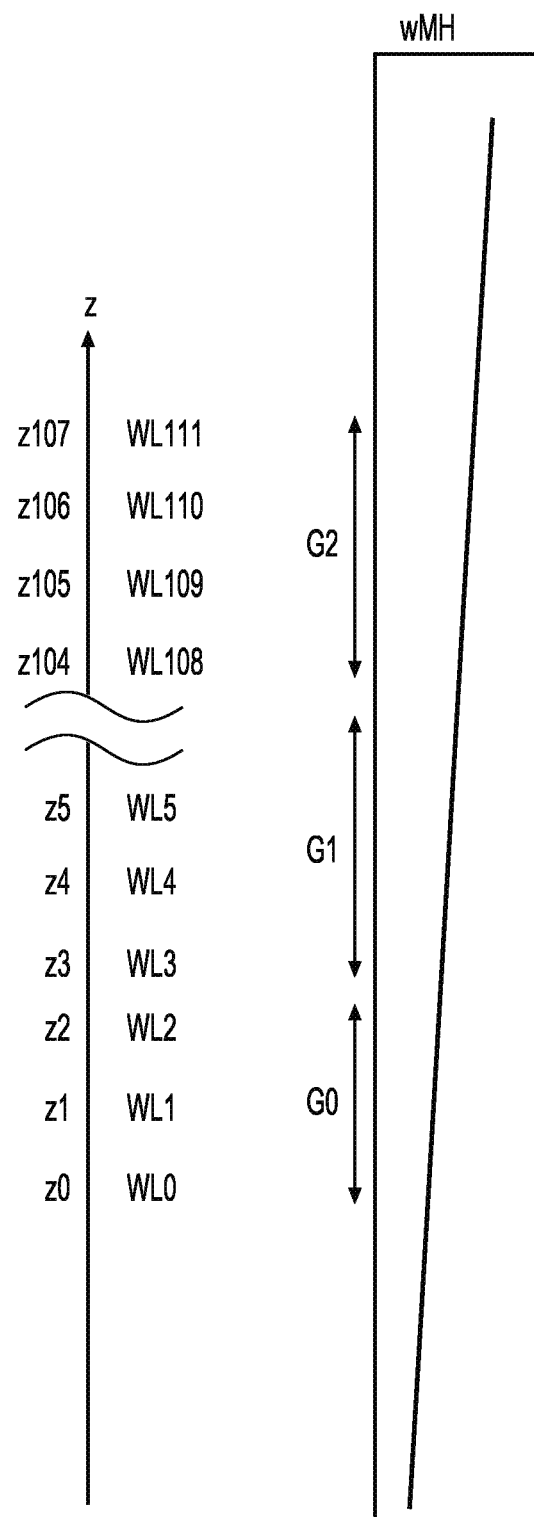
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WL0-WL111 of FIG. 6A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
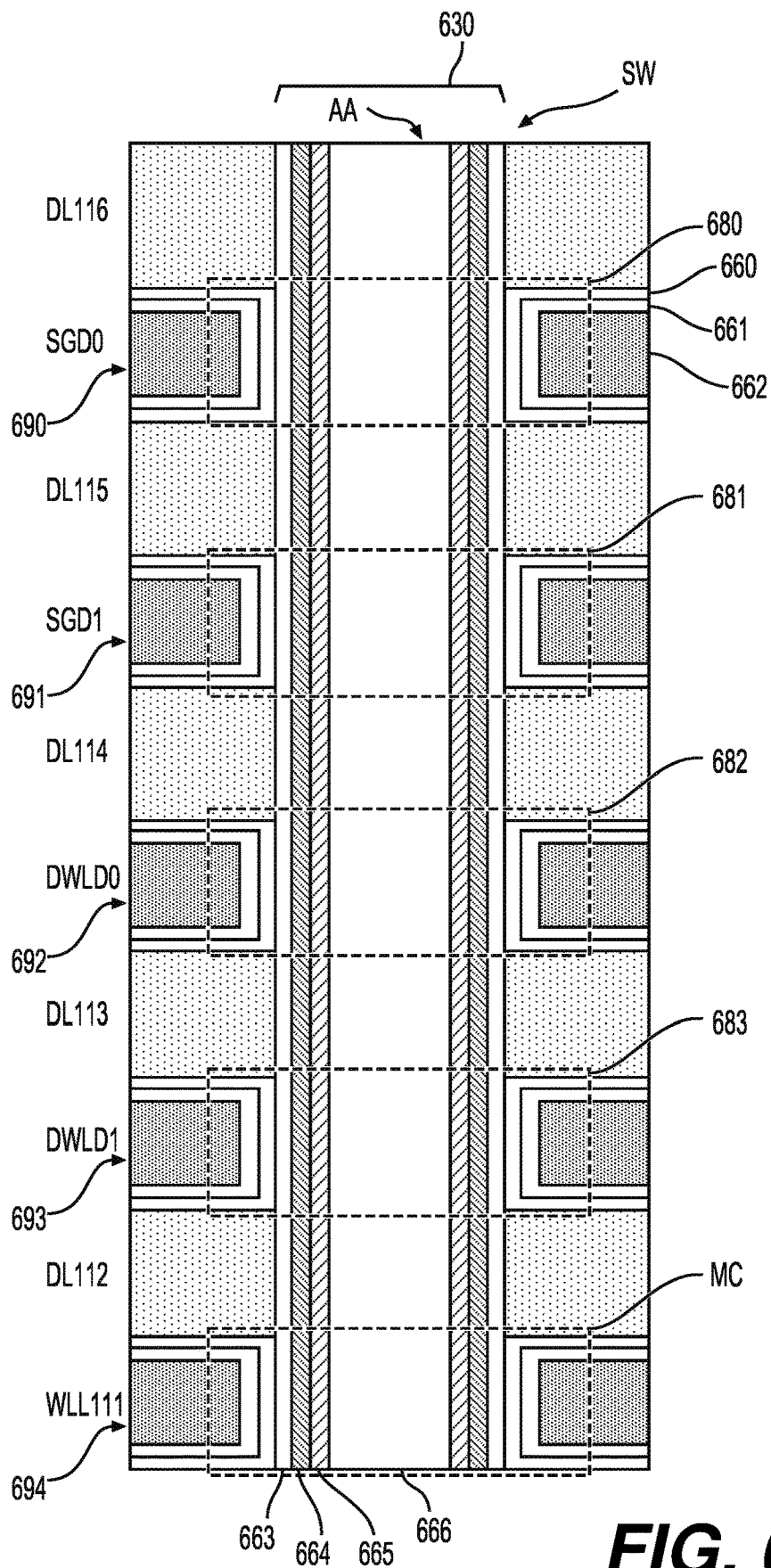
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vt of a memory cell is increased in proportion to the amount of stored charge. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of annular layers are between the core region and the word line in each of the memory holes 630.

The NAND string can be considered to have a floating body channel because the length of the channel is not formed on a substrate. Further, the NAND string is provided by a plurality of word line layers above one another in a stack, and separated from one another by dielectric layers.

Figure 7A:
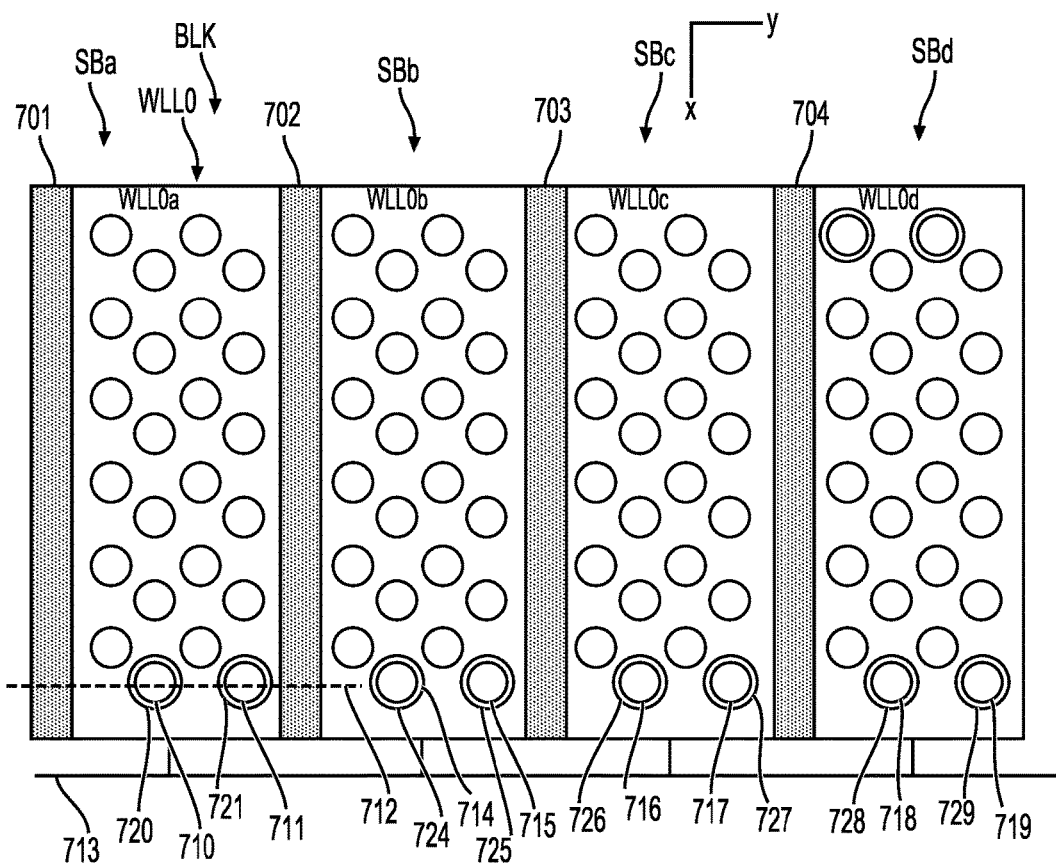
FIG. 7A depicts a top view of an example word line layer WLL0 of the stack of FIG. 6B.

FIG. 7A illustrates a top view of an example word line layer WL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 7B:
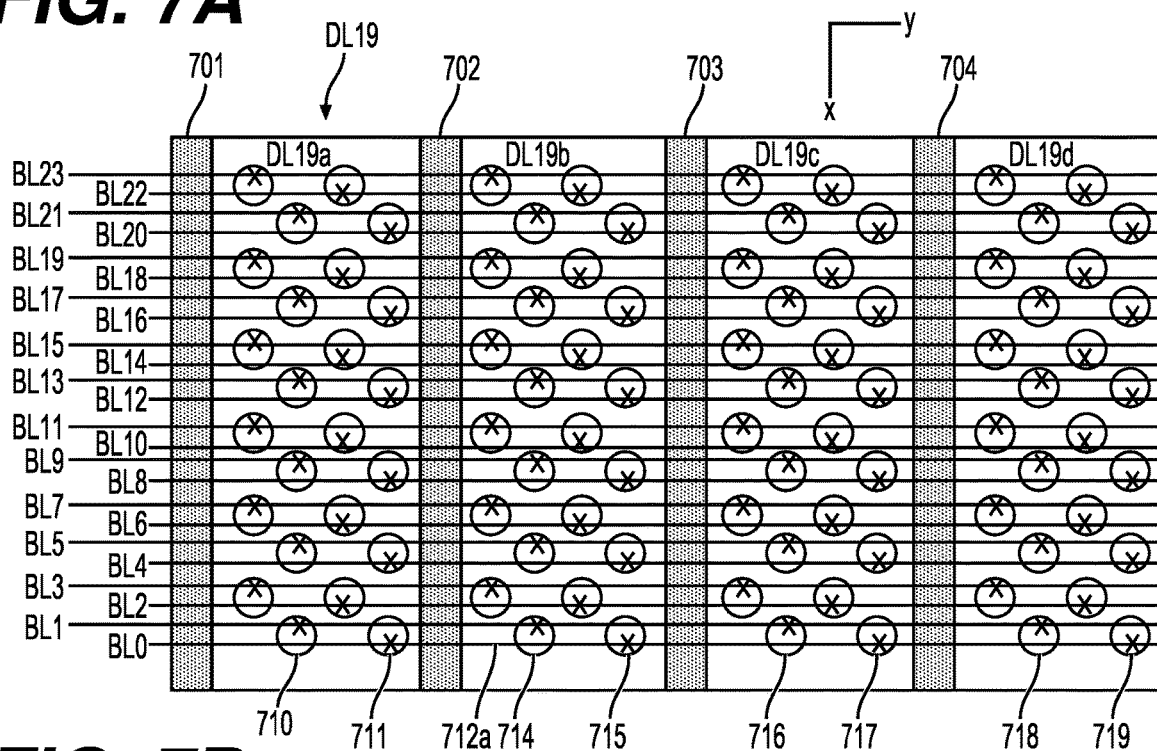
FIG. 7B depicts a top view of an example top dielectric layer DL116 of the stack of FIG. 6B.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0a, WL0b, WL0c and WL0d which are each connected by a contact line 713. The last region of a word line layer in a block can be connected to a first region of a word line layer in a next block, in one approach. The contact line 713, in turn, is connected to a voltage driver for the word line layer. The region WL0a has example memory holes 710, 711 along a contact line 712. The region WL0b has example memory holes 714, 715. The region WL0c has example memory holes 716, 717. The region WL0d has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 720, 721 are in WL0a, memory cells 724, 725 are in WL0b, memory cells 726, 727 are in WL0c, and memory cells 728, 729 are in WL0d. These memory cells are at a common height in the stack.

Contact line connectors (e.g., slits, such as metal-filled slits) 701, 702, 703, 704 may be located between and adjacent to the edges of the regions WL0a-WL0d. The contact line connectors 701, 702, 703, 704 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B illustrates a top view of an example top dielectric layer DL116 of the stack of FIG. 6B. The dielectric layer is divided into regions DL116a, DL116b, DL116c and DL116d. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL116a has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figure 9:
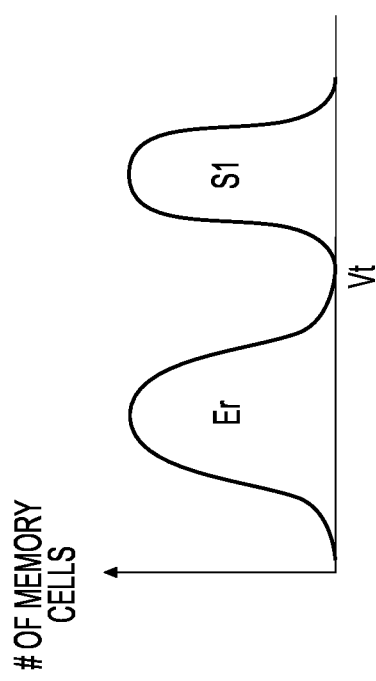
FIG. 9 is a threshold voltage distribution of a group of memory cells programmed to SLC (one bit per memory cell)
Figure 10:
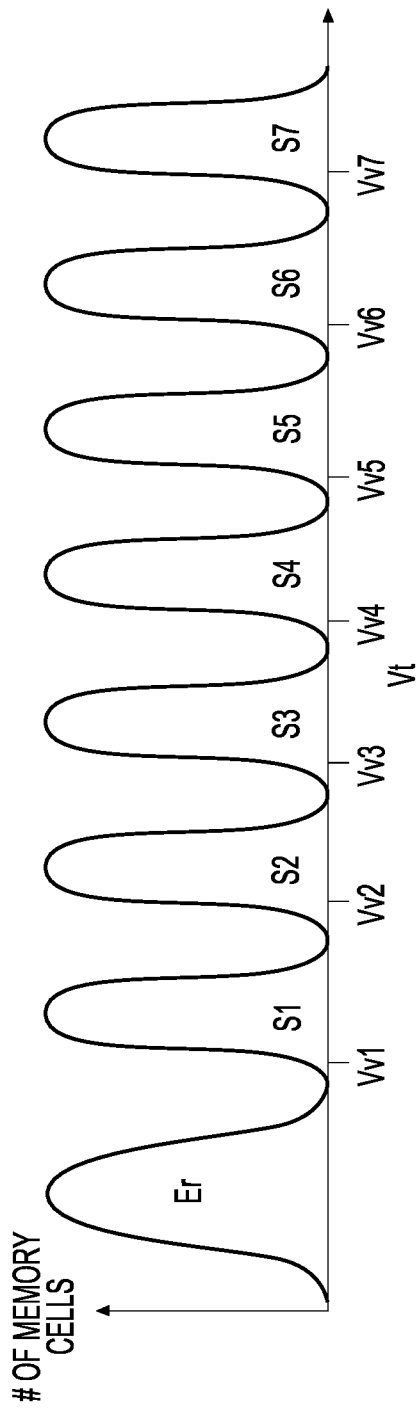
FIG. 10 is a threshold voltage distribution of a group of memory cells programmed to TLC (three bits per memory cell)

The memory cells can be programmed to store one or multiple bits of data in $2^n$ data states where n is a positive integer. Each data state is associated with a respective threshold voltage Vt. For example, FIG. 9 depicts a threshold voltage Vt distribution of a group of memory cells programmed according to a one bit per memory cell (SLC) storage scheme. In the SLC storage scheme, there are two total data states, including the erased state (Er) and a single programmed data state (S1). FIG. 10 illustrates the threshold voltage Vt distribution of a three bits per cell (TLC) storage scheme that includes eight total data states, namely the erased state (Er) and seven programmed data states (S1, S2, S3, S4, S5, S6, and S7). Each programmed data state (S1-S15) is associated with a verify voltage (Vv1-Vv7), which is employed during the verify portion of a program loop, as discussed in further detail below. Other storage schemes are also available, such as two bits per cell (MLC) with four data states or four bits per cell (QLC) with sixteen data states.

Programming starts with the memory cells of a selected word line being in the erased data state. Next, in at least one program loop, an initial programming voltage VPGM is applied to the selected word line. The bit lines coupled to the memory cells of the selected word line are either left at a low voltage to cause electrons to migrate into the charge trapping material of the memory cell, thereby raising the threshold voltage Vt of the memory cell, or the bit lines are held at an inhibit voltage to inhibit programming of the memory cell.

Figure 11:
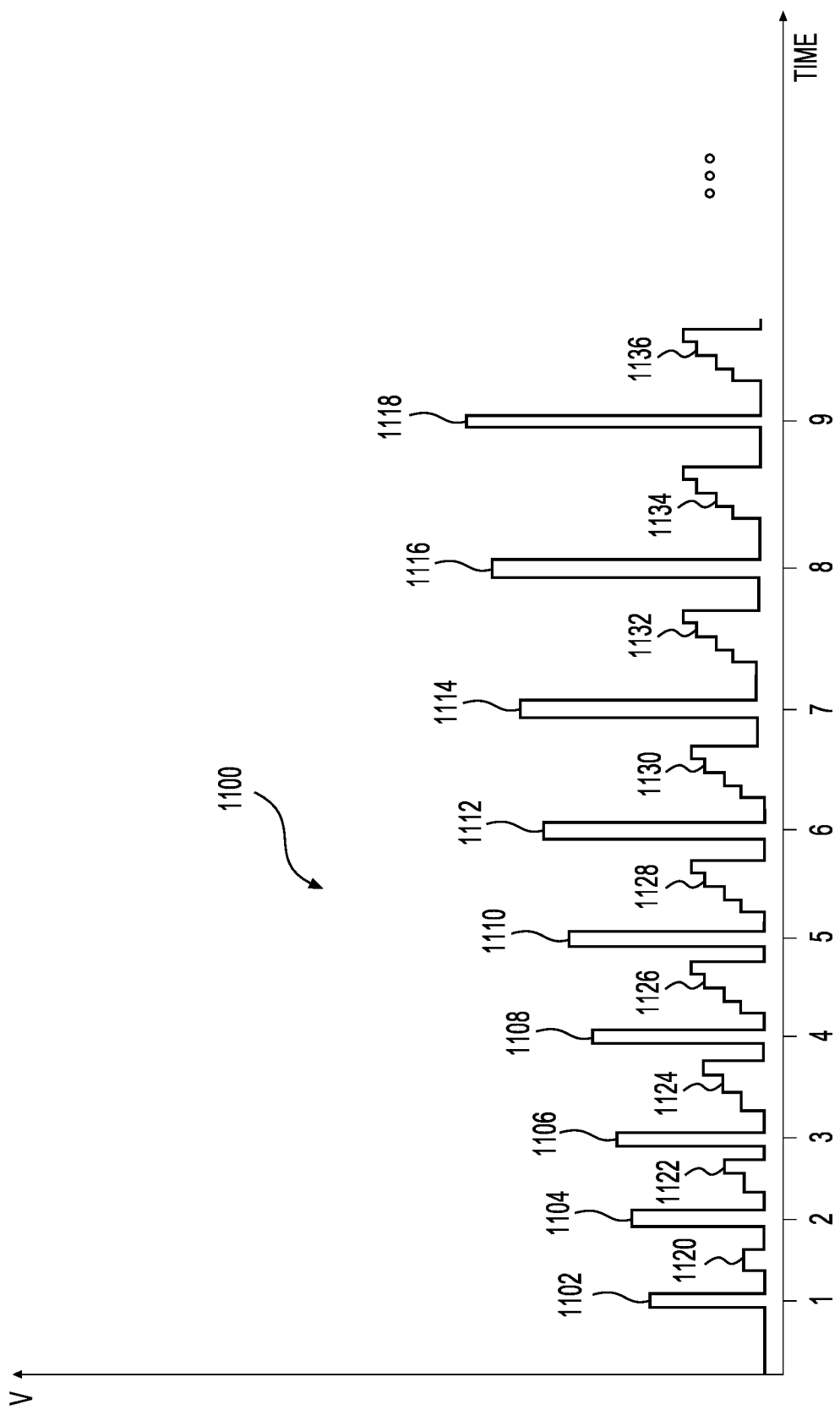
FIG. 11 is a voltage waveform applied during an example programming operation.

Programming to SLC (illustrated in FIG. 9) typically includes only a single programming pulse at a programming voltage VPGMSLC, whereas programming to MLC, TLC, or QLC typically includes a plurality of programming pulses that are applied in a plurality of program loops. FIG. 11 depicts a waveform 1100 of an example memory cell programming operation for programming the memory cells TLC. As depicted, each program loop includes a programming pulse VPGM and one or more verify pulses, depending on which data states are being programmed in a particular program loop. A square waveform is depicted for each pulse for simplicity; however, other shapes are possible, such as a multilevel shape or a ramped shape.

Incremental Step Pulse Programming (ISPP) is used in this example pulse train, which means that the VPGM pulse amplitude steps up in each successive program loop. In other words, the pulse train includes VPGM pulses that increase stepwise in amplitude with each program loop using a fixed step size (dVPGM). A new pulse train starts at an initial VPGM pulse level VPGMU and ends at a final VPGM pulse level, which does not exceed a maximum allowed level. The pulse train 1100 includes a series of Vpgm pulses 1101-1115 that are applied to a selected word line that includes a set of non-volatile memory cells. One or more verify voltage pulses 1116-1129 are provided after each VPGM pulse as an example, based on the target data states which are being verified in the program loop. The verify voltages correspond with the voltages Vv1-Vv7 (shown in FIG. 10) depending on the particular data states that are being programmed in a given program loop. Concurrent with the application of the verify voltages, a sensing operation can determine whether a memory cell has a Vt above the associated verify voltage by sensing a current through a memory cell of the selected word line. If the current is relatively high, this indicates the memory cell is in a conductive state, such that the Vt is less than the verify voltage. If the current is relatively low, this indicates the memory cell is in a non-conductive state, such that the Vt is above the control gate voltage. Programming proceeds until all memory cells pass verify for their intended data states or until a predetermined maximum number of program loops is exceeded.

Figure 12:
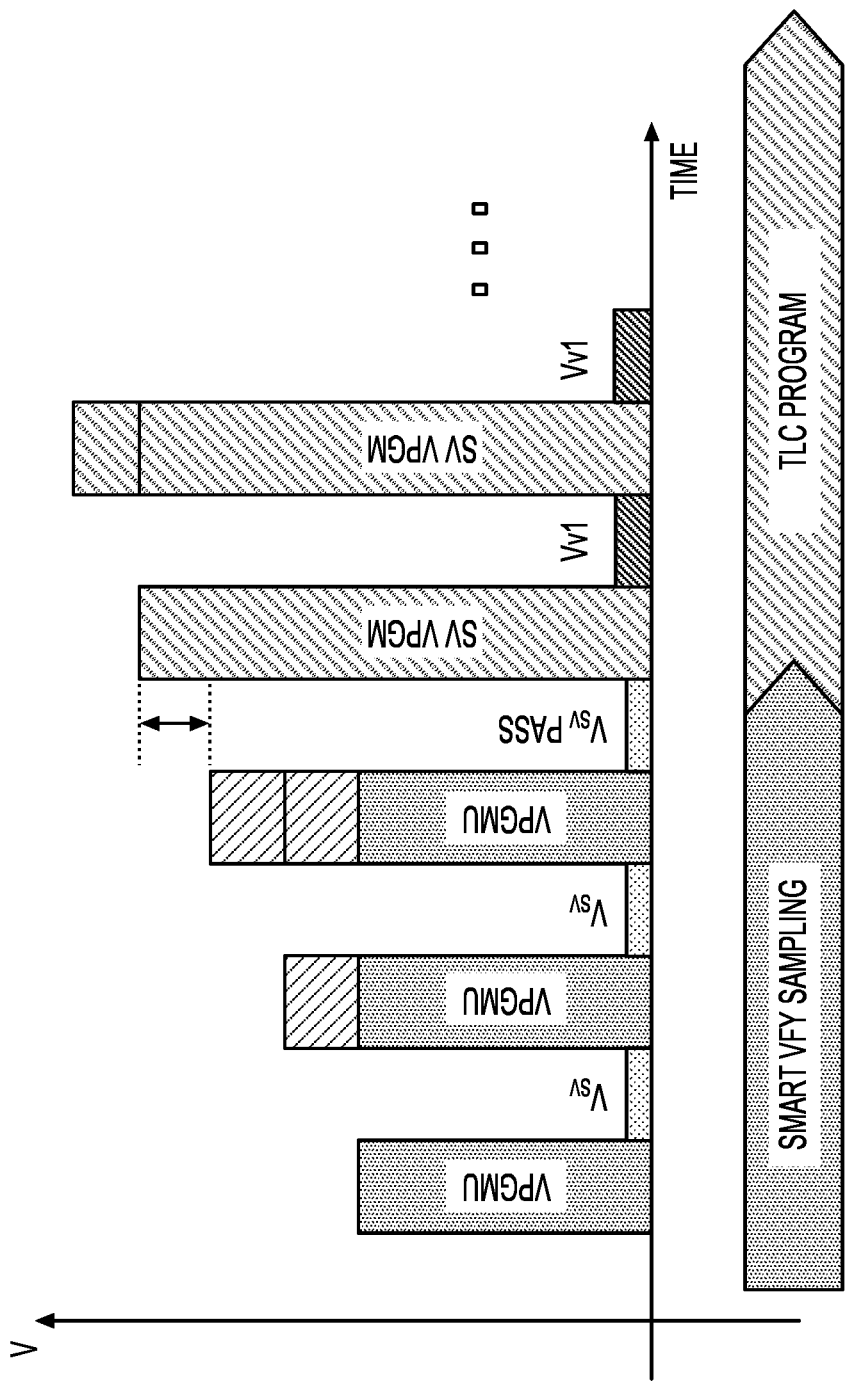
FIG. 12 is a plot of programming and verify voltages during an example programming operation that includes three smart verify program loops.

In some programming operations, a smart verify operation is performed during the first couple of programming loops to improve programming performance, i.e., reduce verify time. During the smart verify program loops, only a portion of the word line (for example, one string) is selected to acquire a suitable VPGM_SV voltage applied as initial VPGM voltage for other WLs or strings. As for smart verify strings, it performs program-verify starting from pre-trimmed initial VPGMU and verifying with Vsv verify level. Referring to FIG. 12, during an example triple level cell (TLC) program operation, smart verify is performed on the word line until a predetermined threshold of memory cells have threshold voltages Vt that exceed Vsv verify level. Upon that predetermined threshold being reached, in all following program loops, the verify voltages that are applied during the verify portion are the verify voltages Vv1-Vv7 associated with the programmed data states. In this example, smart verify passes after three program loops, and in the fourth program loop, the S1 data state is verified using the verify voltage Vv1.

An erase operation involves transitioning the memory cells from their respective programmed data states to the erased state. During the erase operation, it is desired to lower the threshold voltages Vt of the memory cells below an erase-verify level that represents an upper bound of the erased data state. An erase operation can include a number of erase loops, each including an erase portion followed by a verify portion. The erase operation is typically performed on a memory block level rather than a word line level, i.e., one entire memory block at a time.

In the erase portion of an erase loop, the control circuitry is configured to apply an erase voltage VERA to the strings of the memory block while applying a very low voltage (for example, zero Volts) to the word lines of the memory block. This provides a positive channel-to-gate voltage for the memory cells of the block to drive electrons out of the charge storing materials of the memory cells, thereby reducing the threshold voltages Vt of the memory cells. In the verify portion, a verify voltage is applied to the control gates of the memory cells and sensing circuitry is used to sense currents in the NAND strings to determine if the memory cells have been sufficiently erased. If an insufficient number of memory cells have been sufficiently erased, then this process is repeated in one or more subsequent erase loops until the erase verify operation passes.

Figure 8:
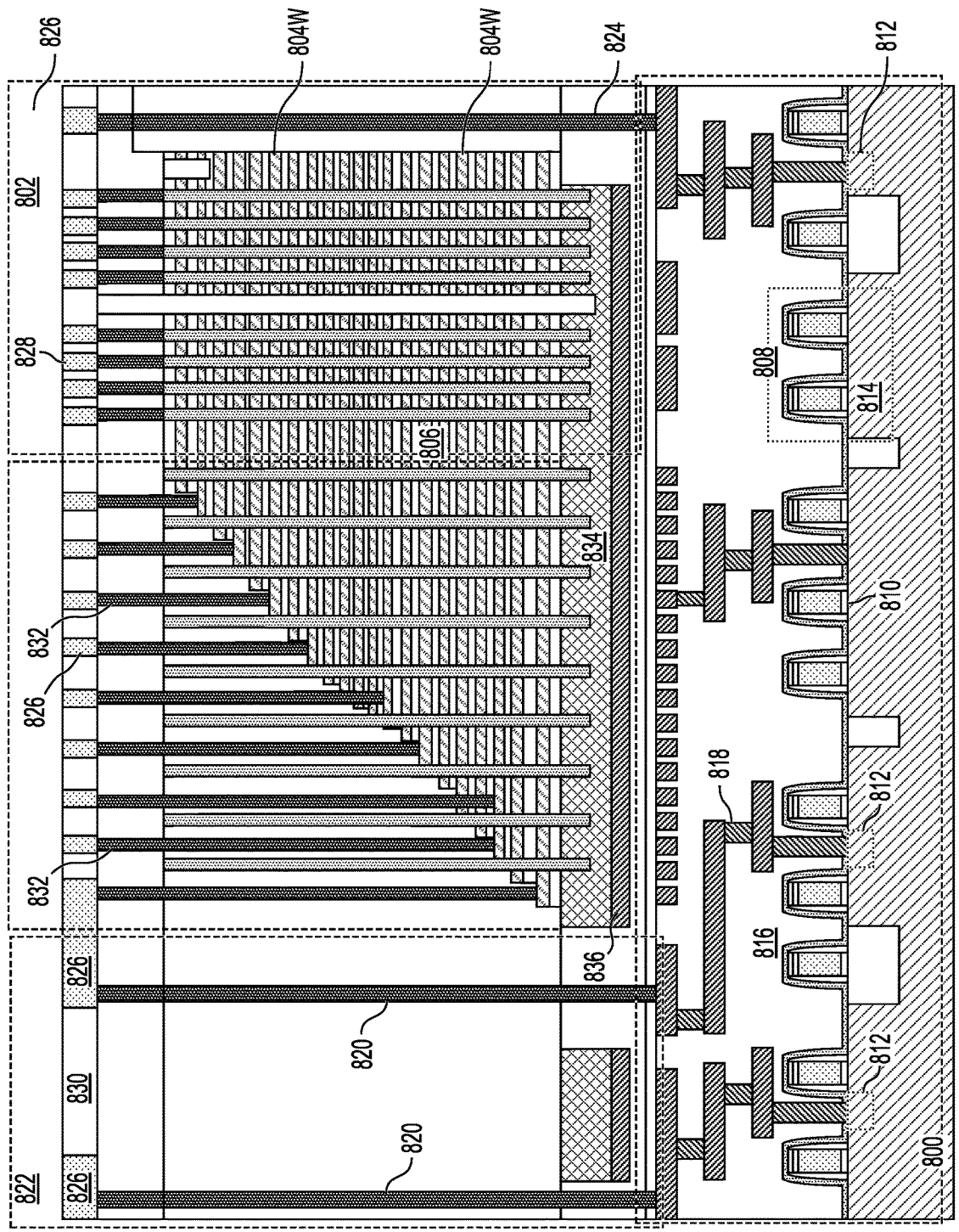
FIG. 8 is a cross-sectional view of a die having an exemplary chip under array (CUA) architecture.

Some memory dies have a CMOS under array ("CUA") architecture whereby peripheral circuitry (e.g., page buffers, sense amplifiers [S/A], charge pumps, etc.) are located underneath a vertical stack of memory cells as opposed to alongside the vertical stack. One such component that is buried underneath the vertical stack is the source line, which provides an erase voltage VERA during an erase operation. An example of a memory device with a CUA architecture is depicted in FIG. 8. In this example, the peripheral semiconductor devices 800 of the memory device are located under the memory array region 802 such that the word lines 804W and the memory opening fill structures 806 are located above the peripheral semiconductor devices 800. It should be appreciated that the erase techniques discussed below may also be applicable to other architectures than CUA.

As shown in FIG. 8, the peripheral semiconductor devices 800 include driver circuit transistors 808 including a gate electrode structure 810, active regions 812 (i.e., source and drain regions) a semiconductor channel 814 located below the gate electrode structure 808. The peripheral semiconductor devices 800 also include lower-level dielectric material layers 816 and the lower-level metal interconnect structures 818 electrically connected to the nodes (e.g., gate electrode structures 810 and/or active regions 812) of the driver circuit transistors (e.g., CMOS type transistors) 808.

Peripheral-region contact via structures 820 in region 822 and/or through-memory-region via structures 824 in region 802 are formed in electrical contact with the lower-level metal interconnect structures 818. Interconnection line structures 826 and bit lines 828 are formed in interconnection level dielectric layer 830. The interconnection line structures 826 electrically connect the contact via structures 832 to the peripheral-region contact via structures 820 and/or the through-memory-region via structures 824. A horizontal source line 834 may include one or more doped polysilicon layers. An optional conductive plate 836, such as a metal or metal silicide plate, may be located in contact with the horizontal source line 834 for improved conductivity. Another die architecture is known as CMOS beside array (CBA), which is similar to the CUA array architecture but has the CMOS wafer located vertically above, rather than beneath, the vertical stack.

In memory devices that have the CUA architecture, because the source line is located underneath the vertical stack, a gate induced drain leakage (GIDL) erase operation is employed to erase the memory cells as opposed to a direct hole injection erase method that may be employed in some other memory devices having different architectures. Referring back to FIG. 6D, during a GIDL erase operation, a high voltage is applied in a vertical semiconductor channel 665.

Figure 13:
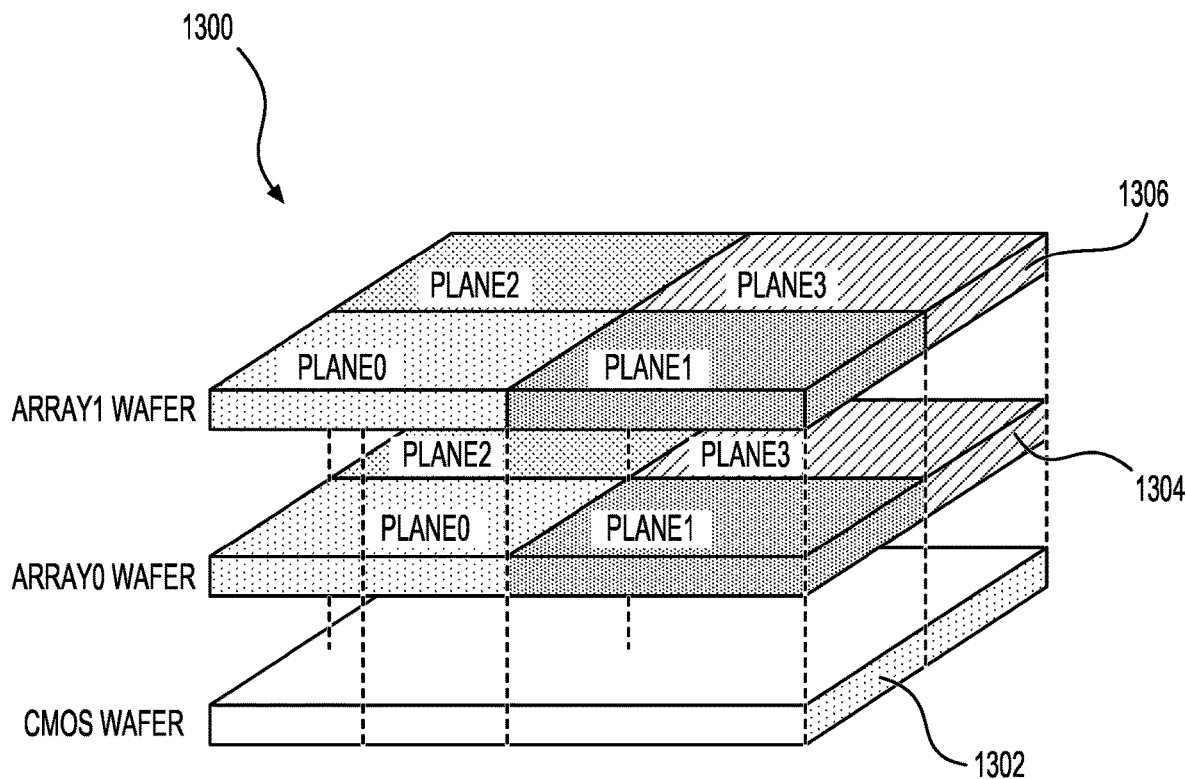
FIG. 13 is an exploded view of a die constructed according to an exemplary embodiment of the present disclosure.
Figure 14:
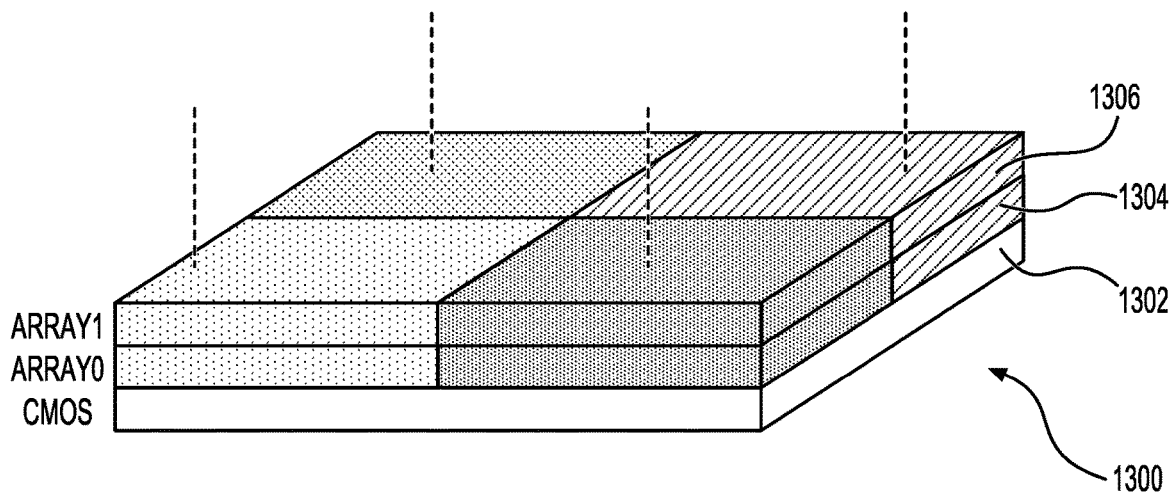
FIG. 14 is another view of the die of FIG. 13.
Figure 15:
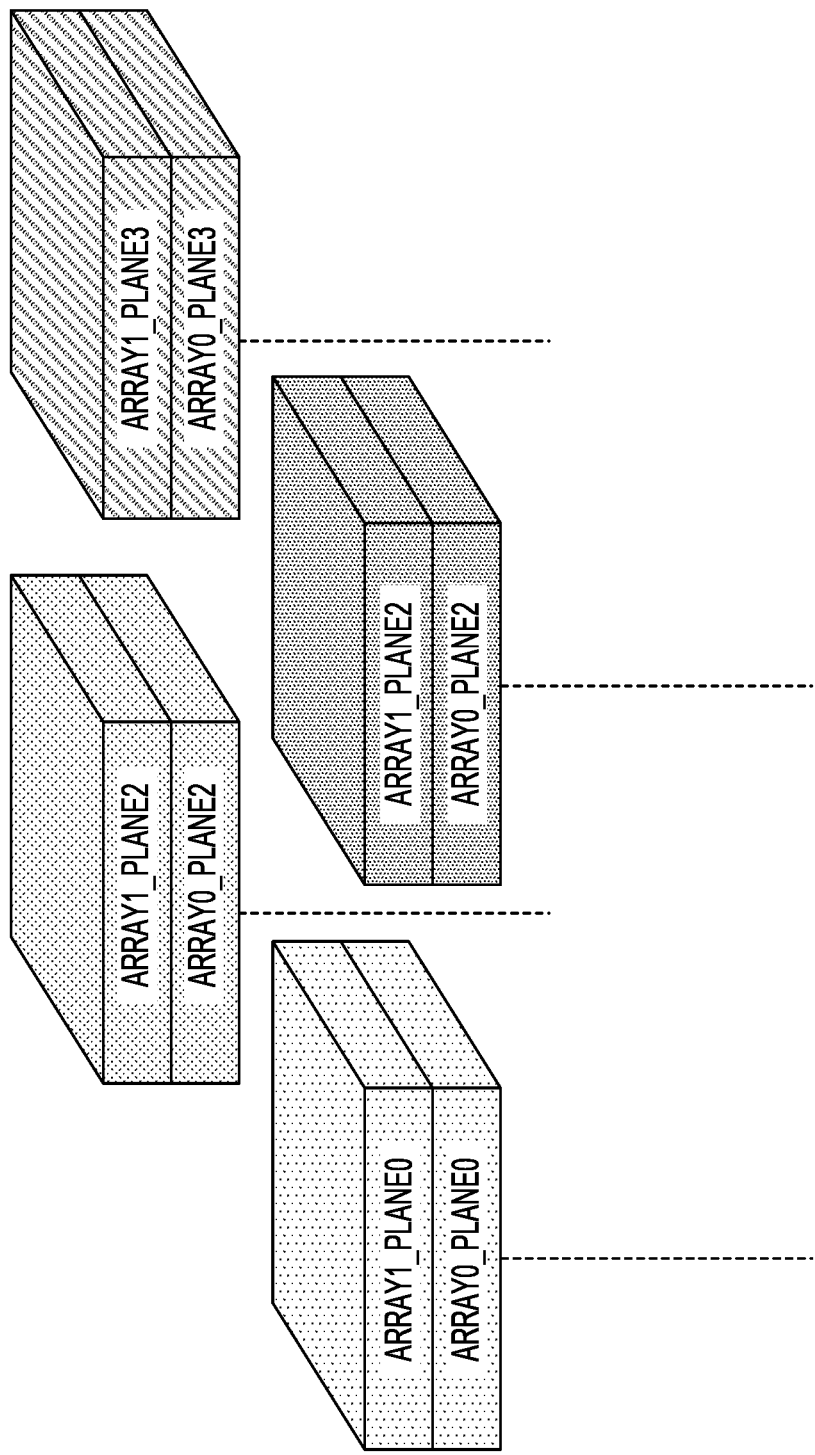
FIG. 15 is an exploded view of the arrays and planes of the die of FIG. 13.

With reference to FIGS. 13-15, one aspect of the present disclosure is related to a die 1300 that has an architecture (hereinafter referred to as CBAn although it is also applicable to CUA configurations) that includes a single CMOS wafer 1302 and multiple array wafers 1304, 1306. In the exemplary embodiment, the die 1300 has a CBA2 architecture in that it includes a single CMOS wafer 1302 and two array wafers, namely the Array0 wafer 1304 and the Array1 wafer 1306. CMOS-to-array pad bonding fixedly attaches the CMOS wafer 1302 with the Array0 wafer 1304, and array-to-array bonding physically attaches the Array0 wafer 1304 with the Array1 wafer 1306. All of these wafers 1302, 1304, 1306 have a similarly shaped outer peripheries, and the wafers 1302, 1304, 1306 are stacked on top of one another with the Array0 wafer 1304 being sandwiched between the CMOS wafer 1302 and the Array1 wafer 1306. Each array wafer 1304, 1306 includes four (4) memory planes (labeled as Plane0-Plane3) arranged in a two-by-two grid, such that the die 1300 has a total of eight (8) memory planes. Table 1 is one example of how the physical plane addresses can be correlated with logical plane addresses.

TABLE 1

| Logical Plane Addresses | Physical Plane Addresses |
| --- | --- |
| Plane 0-Plane 3 | Array 0, Planes 0-3 |
| Plane 4-Plane 7 | Array 1, Planes 0-3 |

In some embodiments, the die may more than two array wafers bonded with a single CMOS wafer. For example, the die may include any number "n" of array wafers with n being an integer that is two or more.

To improve performance, there is a desire to maximize the number of planes in the die that can concurrently or simultaneously undergo operations, such as erasing, programming, and reading operations. This number of concurrent operations is governed by the number of sense amplifier (SA) modules that are present in the CMOS wafer. In other words, if the CMOS wafer contains eight (8) SA modules, then the die can support concurrent operations in eight (8) planes, but if the CMOS wafer contains four (4) SA modules, then the die can support concurrent operations in four (4) planes. In the exemplary embodiment, the CMOS wafer 1302 contains eight (8) SA modules such that concurrent operations in all eight (8) planes between the Array0 and Array1 wafers 1304, 1306 are possible. In other words, the number of SA modules matches the number of planes.

The single CMOS wafer 1302 of the exemplary embodiment further includes control circuitry that is configured to apply different VPGMSLC, VPGMU, and VERA voltages to the memory blocks of the Array0 wafer 1304 as compared to the memory blocks of the Array1 wafer 1306. In other words, during operation a first set of VPGMSLC, VPGMU, and VERA voltages are applied by the CMOS wafer 1302 to the Array0 wafer 1304 during operation and a different second set of VPGMSLC, VPGMU, and VERA voltages are applied by the CMOS wafer 1302 to the Array1 wafer 1306. As discussed in further detail below, supplying different VPGMSLC, VPGMU, and VERA voltages to the memory blocks of the different array wafers 1304, 1306 improves programming and erasing performance and reliability due to different programming and erase efficiencies that inherently result from the CBA2 architecture of the die 1300.

Figure 16:
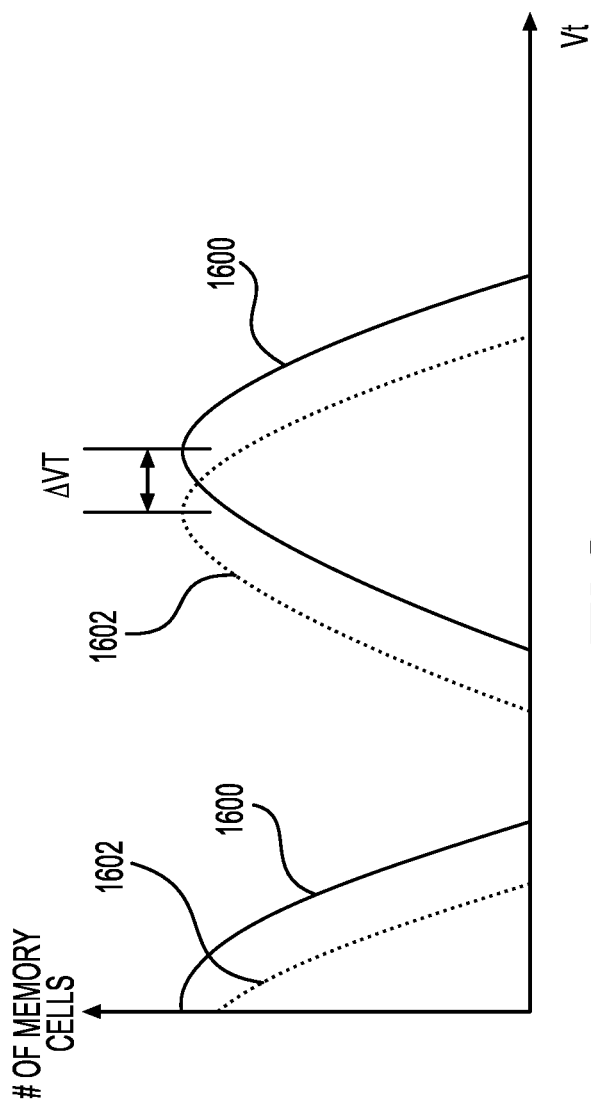
FIG. 16 is a threshold voltage distribution of two groups of memory cells programmed to SLC, one group being in a memory block that has low programming efficiency and the other group being in a memory block that has high programming efficiency.

FIG. 16 illustrates the threshold voltage distributions of memory cells of two blocks from different arrays programmed to SLC using the same programming voltage VPGMSLC. Curves 1600 identifies the distribution of the memory block that has a high programming efficiency, and curves 1602 illustrates the distribution of the memory block that has a low programming efficiency. As illustrated, the threshold voltages of the memory cells in the array with a high programming efficiency have, on average, higher threshold voltages than those in the array with low programming efficiency by a difference that is labeled ΔVt. Accordingly, using a single VPGMSLC for both of these memory blocks either results in inconsistent programming between the memory blocks. Thus, to achieve desired programming, there must be different ideal VPGMSLC voltages for these two memory blocks. Taking it a step further, if a memory device were to use an ideal VPGMSLC_A0 for the memory block with high programming efficiency on both memory blocks, then the memory cells in the block with low programming efficiency would be underprogrammed. Conversely, if a memory device were to use the ideal VPGMSLC_A1 for the memory block with low programming efficiency on both memory blocks, then the memory cells of the block with high programming efficiency would be overprogrammed.

Figure 17:
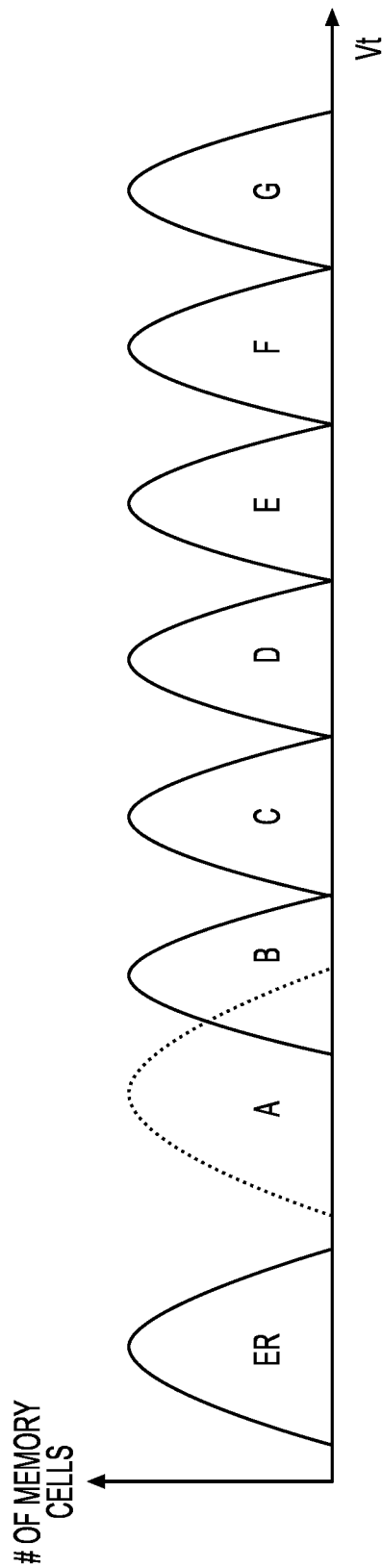
FIG. 17 is a threshold voltage distribution of a group of memory cells in a memory block that has high programming efficiency that are programmed to TLC with an initial programming voltage that is optimized for a memory block with a low programming efficiency.

Similarly, for multi-bit per memory cell programming, such as TLC (three bits per memory cell) or QLC (four bits per memory cell), there is an ideal initial programming voltage VPGMU_A0 for an array with high programming efficiency and a different VPGMU_A1 for an array with low programming efficiency with the magnitude of VPGMU_A0 being less than the magnitude of VPGMU_A1. If VPGMU_A0 is used in the array with low programming efficiency, then performance will decrease as unnecessary program loops will be required to complete programming because the programming voltage in the first one or more program loops will be too low to affect the threshold voltages Vt of the memory cells being programmed. On the other hand, if VPGMU_A1 is used in the array with high programming efficiency, then some of the memory cells in the first programmed data state S1 may be overprogrammed, as illustrated in FIG. 17, which may result in read errors. Thus, if only a single VPGMU is to be employed for arrays having both high and low efficiencies, a choice of performance or reliability must be made.

Similar issues may present themselves if a single erase voltage VERA is used to erase the memory cells in both high and low efficiency arrays, and these issues may be particularly pronounced in a GIDL erase operation. In other words, if an erase voltage VERA_A0 that is ideal for a memory block with high erase efficiency is used to erase the memory cells of an array with low erase efficiency, then unnecessary erase loops may be necessary to complete the erase operation and performance will suffer, but if an erase voltage VERA_A1 that is optimized for an array with low erase efficiency is used to erase the memory cells of an array with high erase efficiency, then some memory cells may be over-erased.

In the exemplary embodiment, due to its location spaced from the CMOS wafer 1302, the Array1 wafer 1306 has lower programming and erasing efficiencies than the Array0 wafer 1304. By providing the CMOS wafer 1302 of the die 1300 of the exemplary embodiment with circuitry that allows for array-dependent VPGMSLC, VPGMU, and VERA voltages, improved consistency, improved performance, and improved reliability across the multiple array wafers 1304, 1306 are realized.

In an example embodiment, the die 1300 is configured to allow concurrent operations to be performed on different planes, and the array-specific or array-dependent VPGMU, VPGMSLC and VERA voltages are achieved by providing the CMOS wafer 1302 with global F_VPGM, F_VPGMSLC and F_VERA supplies along with adjustable voltage regulators that can upwardly or downwardly shift the voltages output from the CMOS wafer 1302 to the memory blocks of one or both of the array wafers 1304, 1306. The global F_VPGMU, F_VPGMSLC, and F_VERA supplies are optimized for programming and erasing the memory cells in only one of the array wafers 1304, 1306 but not the other of the array wafers 1304, 1306. For example, in the example embodiment, the global F_VPGMU, F_VPGMSLC, and F_VERA voltages are optimized for programming the memory cells of the more programming Array0 wafer 1304. In operation, as set forth in the Table 2, when programming or erasing the memory cells in the Array1 wafer 1306, the adjustable voltage regulators in the CMOS wafer 1302 increase the voltage that is output from the CMOS wafer to the Array1 wafer 1306 from the appropriate global voltage F_VPGMU, F_VPGMSLC, F_VERA by an offset voltage F_VPGMU_A1, F_VPGMSLC_A1, F_VERA_S1.

TABLE 2

| | Global VPGM/VERA | Array 0 Offset | Array 1 Offset |
|---|---|---|---|
| TLC/QLC Program Parameter | F_VPGMU | — | F_VPGMU_A1 |
| SLC Program Parameter | F_VPGMSLC | — | F_VPGMSLC_A1 |
| Erase Voltage Parameter | F_VERA | — | F_VERA_A1 |

In some embodiments, the global F_VPGMU, F_VPGMSLC, and F_VERA supplies can be optimized for the less efficient Array1 wafer rather than the more efficient Array0 wafer, and the offset can be applied to the voltages output by the CMOS wafer to the memory blocks of Array0 Because the Array0 wafer is more programming and erasing efficient than the Array1 wafer, in these embodiments, the global F_VPGMU, F_VPGMSLC, and F_VERA voltages are reduced by the offset voltage to optimize these voltages for the Array0 wafer 1304.

In some other embodiments having three or more array wafers bonded to a single CMOS wafer, each additional array wafer (for example, Array2, Array3, etc.) may have its own set of offsets from the global F_VPGMU, F_VPGMSLC, and F_VERA voltages to adjust for varying programming and erasing efficiencies in three or more array wafers such that the VPGMU, VPDMSLC, and VERA voltages that are output by the CMOS wafer are unique to each array wafer.

Figure 18A:
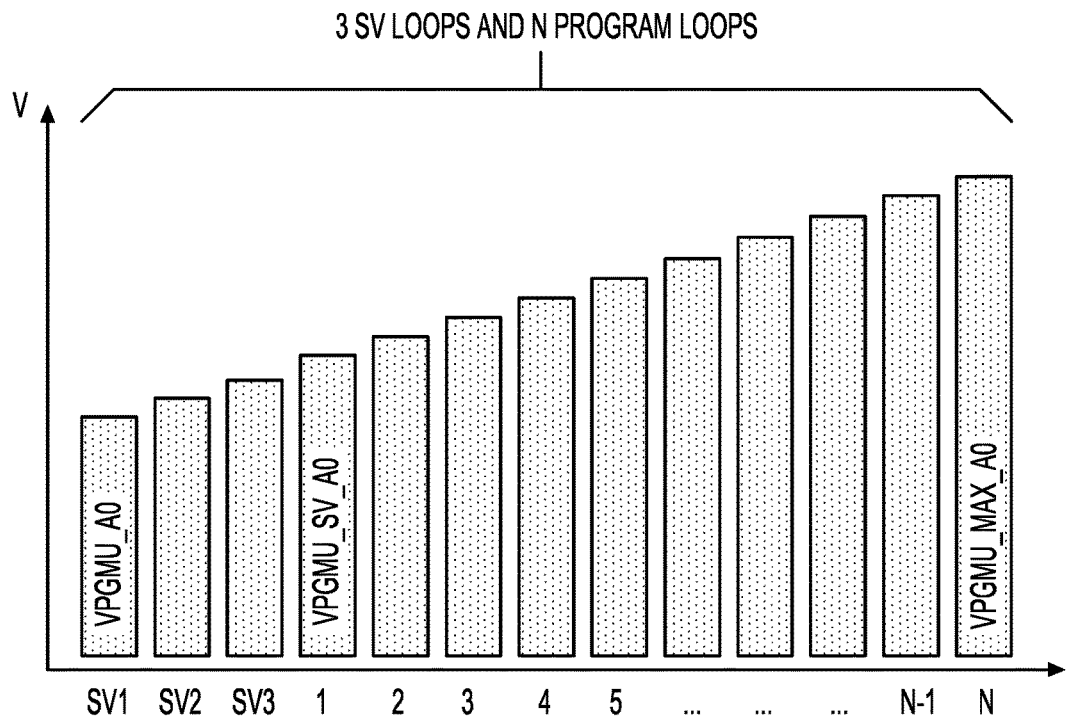
FIG. 18A is a chart of programming voltages applied to a selected word line in different programming loops in a memory block with a high programming efficiency.
Figure 18B:
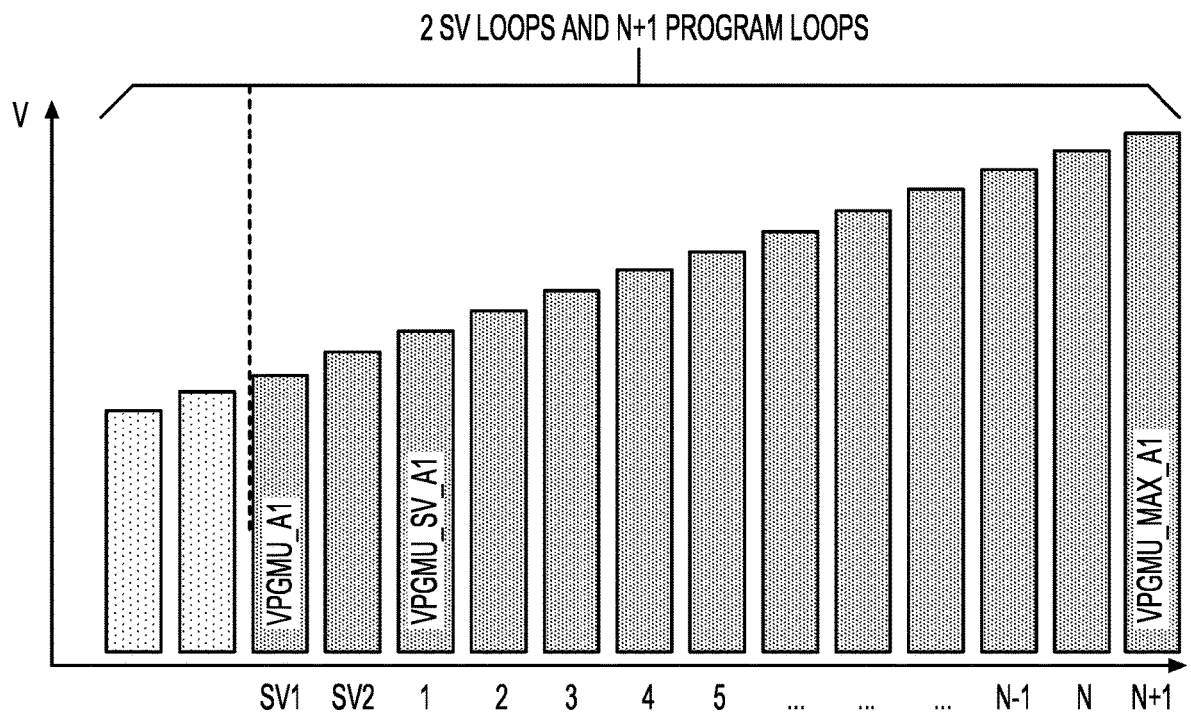
FIG. 18B is a chart of programming voltages applied to a selected word line in different programming loops in a memory block with a low programming efficiency.

Turning now to FIGS. 18A and 18B, the VPGM voltages output by the control circuitry of the CMOS wafer 1302 during programming of selected word lines in memory blocks within the Array0 wafer 1304 (FIG. 18A) and the Array1 wafer 1306 (FIG. 18B) are illustrated. In the Array0 wafer (the array wafer that includes the memory blocks with high programming and erase efficiency), programming begins with the application of a programming voltage VPGMU_A0 in program loop SV1, proceeds through three smart verify (SV) program loops, and then continues for N program loops with full verify. The programming voltage VPGM increases by dVPGM between program loops. The maximum programming voltage VPGM in the final program loop is VPGM_max_A0. Thus, the overall programming operation includes a total of N+3 program loops (3 with SV and N with full verify). In the Array1 wafer 1306, programming begins at the higher VPGM_A1, which is optimized for the memory cells of the Array1 wafer 1306, and continues for only two SV program loops. Due to the lower programming efficiency of the memory blocks of the Array1 wafer 1306 as compared to the Array0 wafer 1304, N+1 program loops with verify are required to complete programming with the maximum programming voltage being VPGM_max_A1. Because programming in Array1 wafer 1306 started with the higher VPGMU_A1 voltage, the overall programming operation also includes a total of N+3 program loops (2 with SV and N+1 with verify), which is less than would have been required if programming had started at VPGMU_A0. Unnecessary program loops building the programming voltage VPGM from VPGM_A0 to VPGM_A1 are not conducted.

Figure 19A:
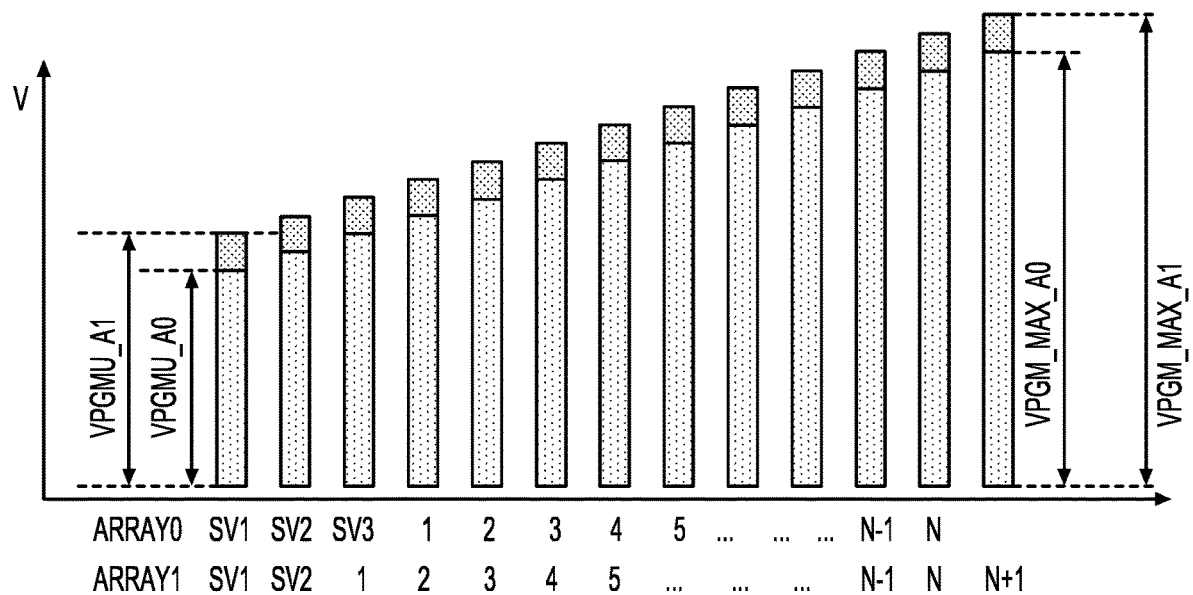
FIG. 19A is a chart of programming voltages applied to a selected word line in different programming loops in both a memory block with a high programming efficiency and a memory block with a low programming efficiency.

Referring now to FIGS. 19A, example programming voltages VPGM applied to selected word lines in the Array0 wafer 1304 and the Array1 wafer 1306 during programming operations that program the memory cells of those word lines to TLC. In this Figure, the VPGM voltages that are applied to the memory blocks of the less programming efficient Array1 wafer 1306 are overlayed on top of the voltages that are applied to the memory blocks of the more programming efficient Array0 wafer 1304. As illustrated, in each pulse, the VPGM voltage applied to the memory blocks of the Array1 wafer 1306 is greater than the voltage applied to the memory blocks of the Array0 wafer 1304 by an offset, and this offset is consistent during the entire programming operation. In this Figure, all of the program loops are offset such that the first program loop of the Array1 wafer 1306 is overlayed on top of the first program loop of the Array0 wafer 1304. In this Figure, smart verify is performed at the beginning of several program loop to acquire VPGM_SV for respective array blocks and then apply VPGM_SV as starting VPGM when programming the following several WLs or strings.

Figure 19B:
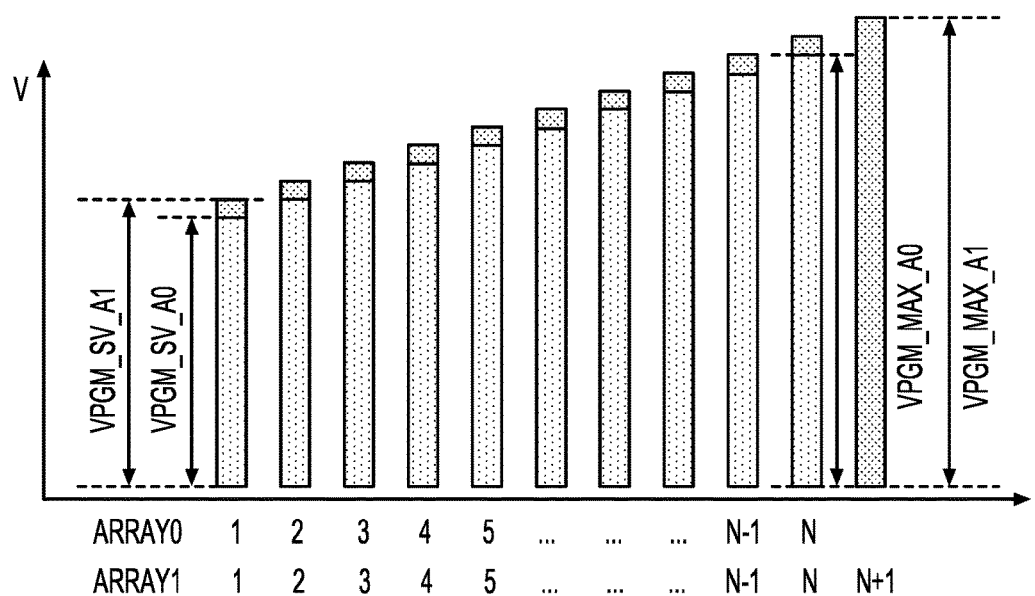
FIG. 19B is a chart of programming voltages applied to a selected word line in different programming loops in both a memory block with a high programming efficiency and a memory block with a low programming efficiency and with the smart verify program loops being removed.

FIG. 19B is similar to FIG. 19A, but starting VPGM is from acquired VPGM_SV rather than VPGMU. In this case, in each program loop from loop 1 to loop N, the offset between the voltage applied to the more programming efficient Array0 wafer 1304 and the less programming efficient Array1 wafer 1306 is equivalent to VPGM_SV_A1−VPGM_SV_A0.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A memory device, comprising:
   a die including a CMOS wafer that includes programming and erasing circuitry;
   a plurality of array wafers coupled with and in electrical communication with the CMOS wafer, the plurality of array wafers including memory blocks with memory cells;
   the plurality of array wafers including a first array wafer that is bonded with the CMOS layer and a second array wafer that is bonded with the first array wafer on an opposite side of the first array wafer from the CMOS layer, the first array wafer having high programming and erasing efficiencies, and the second array wafer having low programming and erasing efficiencies; and
   the programming and erasing circuitry of the CMOS wafer being configured to output at least one of different initial programming voltages and unique erase voltages to the plurality of array wafers.

2. The memory device as set forth in claim 1 wherein the programming and erasing circuitry of the CMOS wafer is configured to output different initial programming voltages to the memory blocks of the first array wafer and to the memory blocks of the second array wafer during programming operations.

3. The memory device as set forth in claim 2 wherein the programming and erasing circuitry is configured to output a first initial programming voltage to the memory blocks of the first array wafer and is configured to apply a second initial programming voltage to the memory blocks of the second array wafer and wherein the second initial programming voltage has a greater magnitude than the first initial programming voltage.

4. The memory device as set forth in claim 2 wherein the different initial programming voltages that the programming and erasing circuitry is configured to output to the memory blocks of the first array wafer and to the memory blocks of the second array wafer include different programming voltages VPGMSLC for programming the memory cells to one bit per memory cell in a single pulse programming operation.

5. The memory device as set forth in claim 2 wherein the different initial programming voltages that the programming and erasing circuitry is configured to output to the memory blocks of the first array wafer and to the memory blocks of the second array wafer include different starting programming voltages VPGMU for programming the memory cells to multiple bits per memory cell in a multi-loop programming operation.

6. The memory device as set forth in claim 1 wherein the programming and erasing circuitry of the CMOS wafer is configured to output different erase voltages to the memory blocks of the first array wafer and to the memory blocks of the second array wafer during erase operations.

7. The memory device as set forth in claim 6 wherein the programming and erasing circuitry is configured to output a first erase voltage to the memory blocks of the first array wafer and to output a second erase voltage to the memory blocks of the second array wafer and wherein the first erase voltage has a greater magnitude than the second erase voltage.

8. A method of operating a memory device, comprising the steps of:
preparing a die that includes a CMOS wafer and a plurality of array wafers that are coupled with and in electrical communication with the CMOS wafer, the plurality of array wafers including memory blocks with memory cells, and the plurality of array wafers including a first array wafer and a second array wafer, the first array wafer being bonded with the CMOS layer and having high programming and erasing efficiencies, and the second array wafer being bonded with the first array wafer on an opposite side of the die from the CMOS wafer and having low programming and erasing efficiencies; and
in programming operations, with programming circuitry in the CMOS wafer, applying a first initial programming voltage to the memory blocks of the first array wafer and applying a second initial programming voltage to the memory blocks of the second array wafer, the first initial programming voltage being different than the second initial programming voltage, or
in erase operations, with erasing circuitry in the CMOS wafer, applying a first erase voltage to the memory blocks of the first array wafer and applying a second erase voltage to the memory blocks of the second array wafer, the first erase voltage being different than the second erase voltage.

9. The method as set forth in claim 8 further including the steps of in programming operations, with the programming circuitry in the CMOS wafer, applying the first initial programming voltage to the memory blocks of the first array wafer and applying the second initial programming voltage to the memory blocks of the second array wafer.

10. The method as set forth in claim 9 wherein the second initial programming voltage has a greater magnitude than the first initial programming voltage.

11. The method as set forth in claim 9 wherein the first initial programming voltage is a VPGMSLC voltage that programs the memory cells in the memory blocks of the first array in a single programming pulse, and wherein the second initial programming voltage is also a VPGMSLC voltage that programs the memory cells in the memory blocks of the second array in a single programming pulse.

12. The method as set forth in claim 9 wherein the first programming voltage is a VPGMU voltage that programs the memory cells in the memory blocks of the first array wafer in a first programming pulse of a multi-loop programming operation, and
wherein the second programming voltage is also a VPGMU voltage that programs the memory cells in the memory blocks of the second array wafer in a first programming pulse of a multi-loop programming operation.

13. The method as set forth in claim 8 further including the steps of in the erase operations, with the erasing circuitry in the CMOS wafer, applying the first erase voltage to the memory blocks of the first array wafer and applying the second erase voltage to the memory blocks of the second array wafer, the first erase voltage being different than the second erase voltage.

14. The method as set forth in claim 13 wherein the second erase voltage has a greater magnitude than the first erase voltage.

* * * * *